United States Patent
Sokabe et al.

(10) Patent No.: US 9,768,158 B2
(45) Date of Patent: Sep. 19, 2017

(54) STATIC ELECTRICITY PROTECTION CIRCUIT, ELECTRO-OPTIC DEVICE AND ELECTRONIC DEVICE

(71) Applicant: Seiko Epson Corporation, Tokyo (JP)

(72) Inventors: Hidenori Sokabe, Chitose (JP); Masahito Yoshii, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/337,234

(22) Filed: Oct. 28, 2016

(65) Prior Publication Data

US 2017/0047318 A1    Feb. 16, 2017

Related U.S. Application Data

(63) Continuation of application No. 14/314,808, filed on Jun. 25, 2014, now Pat. No. 9,515,064.

(30) Foreign Application Priority Data

Jul. 1, 2013   (JP) .................................. 2013-137856

(51) Int. Cl.
*H01L 27/02*  (2006.01)
*H01L 27/12*  (2006.01)

(52) U.S. Cl.
CPC ...... *H01L 27/0266* (2013.01); *H01L 27/1203* (2013.01); *H01L 27/1244* (2013.01)

(58) Field of Classification Search
None
See application file for complete search history.

(56) References Cited

U.S. PATENT DOCUMENTS

| | | |
|---|---|---|
| 6,369,994 B1 | 4/2002 | Voldman |
| 7,295,411 B2 | 11/2007 | Arai et al. |
| 7,755,875 B2 | 7/2010 | Kobashi |
| 7,943,934 B2 | 5/2011 | Yoon |
| 8,692,253 B2 | 4/2014 | Yokogawa |
| 9,515,064 B2 * | 12/2016 | Sokabe ............... H01L 27/0266 |
| 2004/0135206 A1 | 7/2004 | Kato |

(Continued)

FOREIGN PATENT DOCUMENTS

| | | |
|---|---|---|
| JP | 06-112422 A | 4/1994 |
| JP | 2005-064374 A | 3/2005 |

(Continued)

OTHER PUBLICATIONS

Non-Final Office Action received in U.S. Appl. No. 14/314,808, Apr. 28, 2015.

(Continued)

*Primary Examiner* — Benjamin Sandvik
(74) *Attorney, Agent, or Firm* — ALG Intellectual Property, LLC

(57) ABSTRACT

In a static electricity protection circuit according to the invention, a first wiring is electrically connected to a drain of a first p-type transistor and a gate and a source of a first n-type transistor; a second wiring is electrically connected to a gate and a source of the first p-type transistor, a drain of the first n-type transistor, a drain of a second p-type transistor and a gate and a source of a second n-type transistor; and a third wiring is electrically connected to a gate and a source of the second p-type transistor and a drain of the second n-type transistor.

4 Claims, 12 Drawing Sheets

(56) References Cited

U.S. PATENT DOCUMENTS

| | | |
|---|---|---|
| 2005/0087741 A1 | 4/2005 | Yamazaki |
| 2006/0092591 A1 | 5/2006 | Yuan |
| 2007/0246725 A1 | 10/2007 | Yamazaki |
| 2008/0002319 A1 | 1/2008 | Moon et al. |
| 2009/0251834 A1 | 10/2009 | Kobashi |
| 2010/0084654 A1 | 4/2010 | Yamazaki et al. |
| 2011/0234932 A1 | 9/2011 | Jung |
| 2012/0268849 A1 | 10/2012 | Tomatsu |
| 2013/0250201 A1 | 9/2013 | Kobashi |

FOREIGN PATENT DOCUMENTS

| | | |
|---|---|---|
| JP | 2005-135991 A | 5/2005 |
| JP | 2006-018165 A | 1/2006 |
| JP | 2011-018775 A | 1/2011 |

OTHER PUBLICATIONS

Final Office Action received in U.S. Appl. No. 14/314,808, Aug. 20, 2015.

Non-Final Office Action received in U.S. Appl. No. 14/314,808, Apr. 4, 2016.

Notice of Allowance and Notice of Allowability received in U.S. Appl. No. 14/314,808, Aug. 2, 2016.

\* cited by examiner

STATIC ELECTRICITY PROTECTION CIRCUIT, ELECTRO-OPTIC DEVICE AND ELECTRONIC DEVICE

The present application is a continuation application of U.S. patent application Ser. No. 14/314,808 filed on Jun. 25, 2014, which claims priority from Japanese Patent Application No. 2013-137856 filed Jul. 1, 2013, each of which are expressly incorporated by reference herein.

BACKGROUND

1. Technical Field

The present invention relates to a static electricity protection circuit, an electro-optic device including the static electricity protection circuit and an electronic device including the electro-optic device.

2. Related Art

Active driving type liquid crystal devices as electro-optic devices include pixels for modulating light, semiconductor circuits (a scanning line driving circuit, a data line driving circuit and the like) for driving the pixels, and the like. In such a liquid crystal device, sometimes, transistors constituting the pixels and the semiconductor circuits are subjected to a non-recoverable electrostatic damage due to static electricity, and thus, it is important to take measures against static electricity for restricting the influence of static electricity. For example, in JP-A-2006-18165, a liquid crystal device provided with an electrostatic protection circuit (a static electricity protection circuit) has been proposed.

FIG. 16 is a circuit diagram of a static electricity protection circuit described in JP-A-2006-18165. As shown in FIG. 16, a static electricity protection circuit 500 described in JP-A-2006-18165 includes a p-type transistor 504 and an n-type transistor 505. The source and the gate of the p-type transistor 504 are connected to a high electric potential wiring 502 and are supplied with an electric potential VH. The source and the gate of the n-type transistor 505 are connected to a low electric potential wiring 503 and are supplied with an electric potential VL which is lower than the electric potential VH. The drain of the p-type transistor 504 and the drain of the n-type transistor 505 are connected to a signal wiring 501.

When the electric potential of the signal wiring 501 is within a range between the electric potential VL and the electric potential VH, the p-type transistor 504 and the n-type transistor 505 are in off-state, and any electric interference among the signal wiring 501, the high electric potential wiring 502 and the low electric potential wiring 503 does not occur, so that the liquid crystal device operates normally. When the electric potential of the signal wiring 501 deviates from the range between the electric potential VL and the electric potential VH due to static electricity, one of the p-type transistor 504 and the n-type transistor 505 becomes in on-state (in a conducting state). For example, when the electric potential of the signal wiring 501 becomes higher than VH due to static electricity, the p-type transistor 504 becomes in on-state. When the electric potential of the signal wiring 501 becomes lower than VL due to static electricity, the n-type transistor 505 becomes in on-state. In this way, when the electric potential of the signal wiring 501 varies due to static electricity, a path leading from the signal wiring 501 to either the high electric potential wiring 502 or the low electric potential wiring 503 becomes in a conducting state. Further, charges caused on the signal wiring 501 by static electricity are distributed to a path leading to the high electric potential 502 or a path leading to the low electric potential 503, whichever has become in a conducting state, so that an amount of the variation of the electric potential of the signal wiring 501 due to static electricity becomes small. Since an amount of the variation of the electric potential of the signal wiring 501 due to static electricity becomes small, a non-recoverable electrostatic damage (electrostatic destruction) on semiconductor circuits connected to the signal wiring 501 becomes unlikely to occur.

As described above, in the static electricity protection circuit 500 described in JP-A-2006-18165, when positive charges are caused on the signal wiring 501 by static electricity, the p-type transistor 504 becomes in on-state, and the positive charges caused on the signal wiring 501 are distributed (discharged) to a path leading to the high electric potential wiring 502 via the p-type transistor 504, so that an amount of a variation of the electric potential of the signal wiring 501 due to static electricity becomes small. Nevertheless, the mobility of carriers (holes) of the p-type transistor 504 is smaller than the mobility of carriers (electrons) of the n-type transistor 505, and thus, in a case of the p-type transistor 504, an electric current (charges) is (are) more unlikely to flow, as compared with a case of the n-type transistor 505. For this reason, when a large number of positive charges are caused on the signal wiring 501 by static electricity, a sufficient number of the positive charges are not distributed (discharged) to the path leading to the high electric potential wiring 502 via the p-type transistor 504 and an amount of the variation of the electric potential of the signal wiring 501 becomes large, so that a non-recoverable electrostatic damage (electrostatic destruction) on semiconductor circuits, the n-type transistor 505 in a non-conducting state and the like which are connected to the signal wiring 501 is likely to occur.

SUMMARY

An advantage of some aspects of the invention is to solve at least part of the aforementioned problem. The invention can be realized as application examples and embodiments which will be described below.

Application Example 1

A static electricity protection device according to this application example 1 includes a first p-type transistor; a first n-type transistor; a second p-type transistor; a second n-type transistor, a first wiring; a second wiring; and a third wiring. Further, the first wiring is electrically connected to one of a source and a drain of the first p-type transistor, a gate of the first n-type transistor and one of a source and a drain of the first n-type transistor; the second wiring is electrically connected to a gate of the first p-type transistor, the other one of the source and the drain of the first p-type transistor, the other one of the source and the drain of the first n-type transistor, one of a source and a drain of the second p-type transistor, a gate of the second n-type transistor and one of a source and a drain of the second n-type transistor; and the third wiring is electrically connected to a gate of the second p-type transistor, the other one of the source and the drain of the second p-type transistor and the other one of the source and the drain of the second n-type transistor.

When positive charges are caused on the second wiring by static electricity, the gate of the first p-type transistor has a positive electric potential and the gate of the first n-type transistor has a negative electric potential, so that the first p-type transistor and the first n-type transistor each become in off-state (in a non-conducting state). When negative charges are caused on the second wiring by static electricity, the gate of the first p-type transistor has a negative electric potential and the gate of the first n-type transistor has a positive electric potential, so that the first p-type transistor and the first n-type transistor each become in on-state (in a conducting state). That is, paths leading from the second wiring to the first wiring become in a conducting state.

When positive charges are caused on the second wiring by static electricity, the gate of the second p-type transistor has a negative electric potential and the gate of the second n-type transistor has a positive electric potential, so that the second p-type transistor and the first n-type transistor each become in a conducting state. That is, paths leading from the second wiring to the third wiring become in a conducting state. When negative charges are caused on the second wiring by static electricity, the gate of the second p-type transistor has a positive electric potential and the gate of the second n-type transistor has a negative electric potential, so that the second p-type transistor and the second n-type transistor each become in a non-conducting state.

Accordingly, when negative charges are caused on the second wiring by static electricity, paths leading from the second wiring to the first wiring become in a conducting state, so that the negative charges caused on the second wiring are distributed (discharged) to the paths leading to the first wiring via the first p-type transistor and the first n-type transistor. When positive charges are caused on the second wiring by static electricity, paths leading from the second wiring to the third wiring become in a conducting state, so that the positive charges caused on the second wiring are distributed (discharged) to the paths leading to the third wiring via the second p-type transistor and the second n-type transistor.

In this way, in the static electricity protection circuit according to this application example 1, when positive charges or negative charges are caused on the second wiring by static electricity, one of the two p-type transistors and one of the two n-type transistors become in a conducting state. As compared with the static electricity protection circuit according to the well-known technology, in which one of a p-type transistor and an n-type transistor becomes in a conducting state due to static electricity, in the static electricity protection circuit according to this application example 1, the number of paths through which the charges caused by static electricity flow becomes larger, so that discharge capability (electricity removal capability) on charges caused by static electricity becomes superior and the charges can be more promptly discharged.

Further, in a case of a p-type transistor, charges are more unlikely to flow, as compared with a case of an n-type transistor, and thus, in the static electricity protection circuit according to the well-known technology, there is a difference in discharge capability on charges caused by static electricity between a case where a p-type transistor becomes in a conducting state and a case where an n-type transistor becomes in a conducting state. That is, in the static electricity protection circuit according to the well-known technology, there occurs an asymmetric diversity, that is, a difference in discharge capability on charges caused by static electricity between a case where positive charges are caused by static electricity and a case where negative charges are caused by static electricity. In the static electricity protection circuit according to this application example 1, when negative charges or positive charges are caused on the second wiring by static electricity, both of a p-type transistor and an n-type transistor constantly become in a conducting state, and thus, such asymmetric diversity in discharge capability of the static electricity protection circuit according to the well-known technology is eliminated, and the charges caused by static electricity can be stably discharged.

Accordingly, the positive charges or the negative charges caused on the second wiring by static electricity are stably and promptly discharged to paths leading to the first wiring or paths leading to the third wiring, whichever has become in a conduction state, by the static electricity protection circuit according to this application example 1, and thus, an amount of a variation of the electric potential of the second wiring due to static electricity becomes small. Accordingly, a non-recoverable electrostatic damage (electrostatic destruction) on semiconductor circuits connected to the second wiring becomes unlikely to occur.

Application Example 2

In the static electricity protection circuit according to application example 1 described above, preferably, the first wiring is a first power supply wiring, the second wiring is a signal wiring, and the third wiring is a second power supply wiring.

When the electric potential of the first wiring (the first power supply wiring), the electric potential of the second wiring (the signal wiring) and the electric potential of the third wiring (the second power supply wiring) are each set so as to become higher in this order, the gate of the first p-type transistor and the gate of the second p-type transistor each have a positive electric potential and the gate of the first n-type transistor and the gate of the second n-type transistor each have a negative electric potential, so that each of all the first p-type transistor, the first n-type transistor, the second p-type transistor and the second n-type transistor becomes in a non-conducting state. That is, when the electric potential of the first wiring, the electric potential of the second wiring and the electric potential of the third wiring are each set so as to become higher in this order, the transistors disposed in the static electricity protection circuit become in a non-conducting state, and thus, any electric interference between the first wiring and the third wiring does not occur. Accordingly, when the static electricity protection circuit according to application example 1 described above is applied to the three kinds of wirings supplied with such electric potentials, transistors disposed in the static electricity protection circuit become in a conducting state only when the electric potential of the second wiring varies due to static electricity, and thereby the charges caused on the second wiring by static electricity can be distributed (discharged) to paths leading to the first wiring or paths leading to the third wiring, whichever has become in a conducting state. Thus, an amount of the variation of the electric potential of the second wiring due to static electricity becomes small, so that a non-recoverable electrostatic damage (electrostatic destruction) on semiconductor circuits connected to the second wiring becomes unlikely to occur.

Application Example 3

In the static electricity protection circuit according to any one of application example 1 and application example 2 which have been described above, preferably, an amount of capacitance of the first wiring and an amount of capacitance of the third wiring are each larger that an amount of capacitance of the second wiring.

When negative charges are caused on the second wiring by static electricity and paths leading from the second wiring to the first wiring become in a conducting state, since the capacitance of the first wiring is larger than the capacitance of the second wiring, as compared with the a case where the capacitance of the first wiring is smaller than the capacitance of the second wiring, a larger amount of the negative charges caused on the second wiring are distributed (discharged) to the paths leading to the first wiring, which have become in a conduction state, so that an amount of the variation of the electric potential of the second wiring due to static electricity can be made smaller.

When positive charges are caused on the second wiring by static electricity and paths leading from the second wiring to the third wiring become in a conducting state, since the capacitance of the third wiring is larger than the capacitance of the second wiring, as compared with a case where the capacitance of the third wiring is smaller than the capacitance of the second wiring, a larger amount of the positive charges caused on the second wiring are distributed (discharged) to the paths leading to the third wiring, which have become in a conduction state, so that an amount of the variation of the electric potential of the second wiring due to static electricity can be made smaller.

Application Example 4

An electro-optic device according to this application example 4 includes the static electricity protection circuit according to any one of application examples 1 to 3 described above.

The electro-optic device according to this application example includes the static electricity protection circuit according to any one of application examples 1 to 3 described above, and thus, the influence of static electricity is restricted, so that the resistance against static electricity with respect to the electro-optic device, that is, the reliability of the electro-optic device, can be improved.

Application Example 5

An electronic device according to this application example 5 includes the static electricity protection circuit according to any one of application examples 1 to 3 described above, and/or the electro-optic device according to application example 4 described above.

The electronic device according to this application example 5 includes the static electricity protection circuit according to any one of application examples 1 to 3 described above, and/or the electro-optic device including the static electricity protection circuit according to any one of application examples 1 to 3 described above, and thus, the influence of electric potential is restricted, so that the resistance against static electricity with respect to the electronic device, that is, the reliability of the electronic device can be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments according to the invention will be described with reference to the drawings. Embodiments described below do not limit the scope of the invention but are just for exemplification of the invention, and are appropriately susceptible to modifications within the scope of the technical idea of the invention. In addition, in relevant drawings below, in order to make the sizes of individual layers and members large enough to be recognizable on the drawings, the scales of the individual layers and members are made different from actual scales thereof.

Embodiment 1

Outline of Liquid Crystal Display

A liquid crystal device 100 according to embodiment 1 is an example of an electro-optic device and is a transparent type liquid crystal device provided with thin film transistors (hereinafter, which will be referred to as TFTs) 30. The liquid crystal device 100 according to this embodiment is a device which can be suitably used as, for example, an optical modulation element of a projection type display device (a liquid crystal projector) which will be described below.

Figure 1:
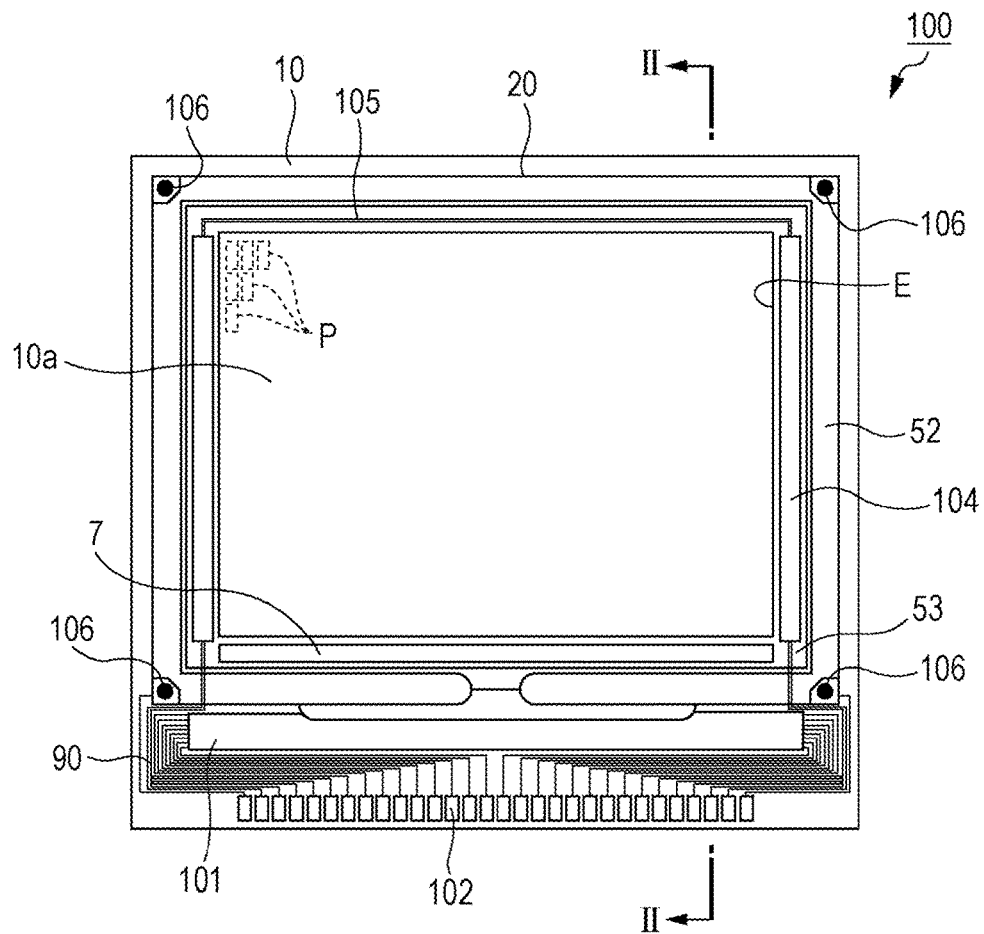
FIG. 1 is a schematic plan view illustrating a configuration of a liquid crystal device according to embodiment 1.
Figure 2:
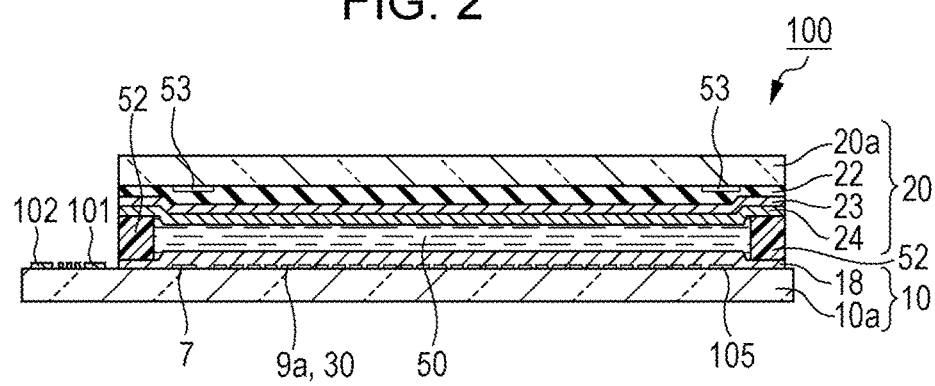
FIG. 2 is a schematic cross-sectional view taken along the line II-II of FIG. 1.
Figure 3:
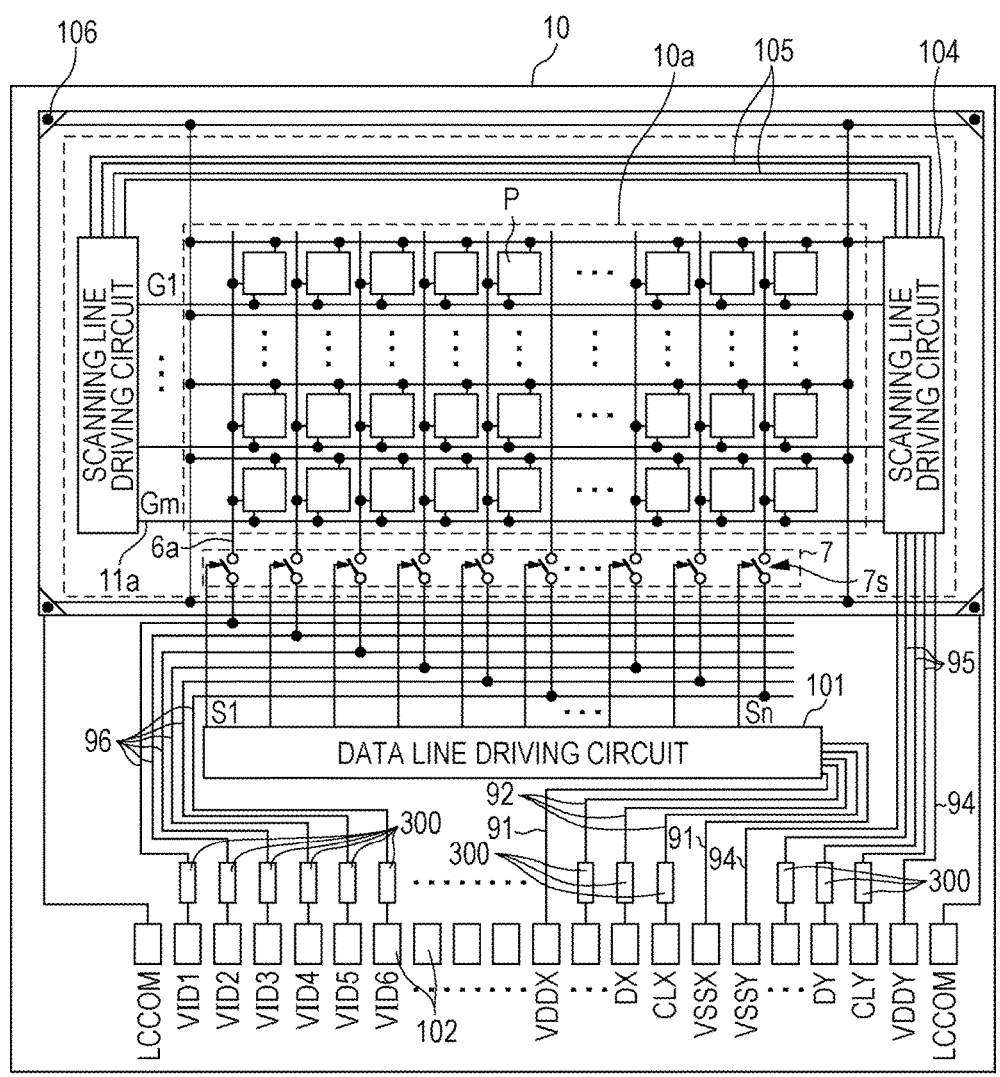
FIG. 3 is a circuit diagram illustrating a configuration of main circuits of a liquid crystal device according to embodiment 1.
Figure 4:
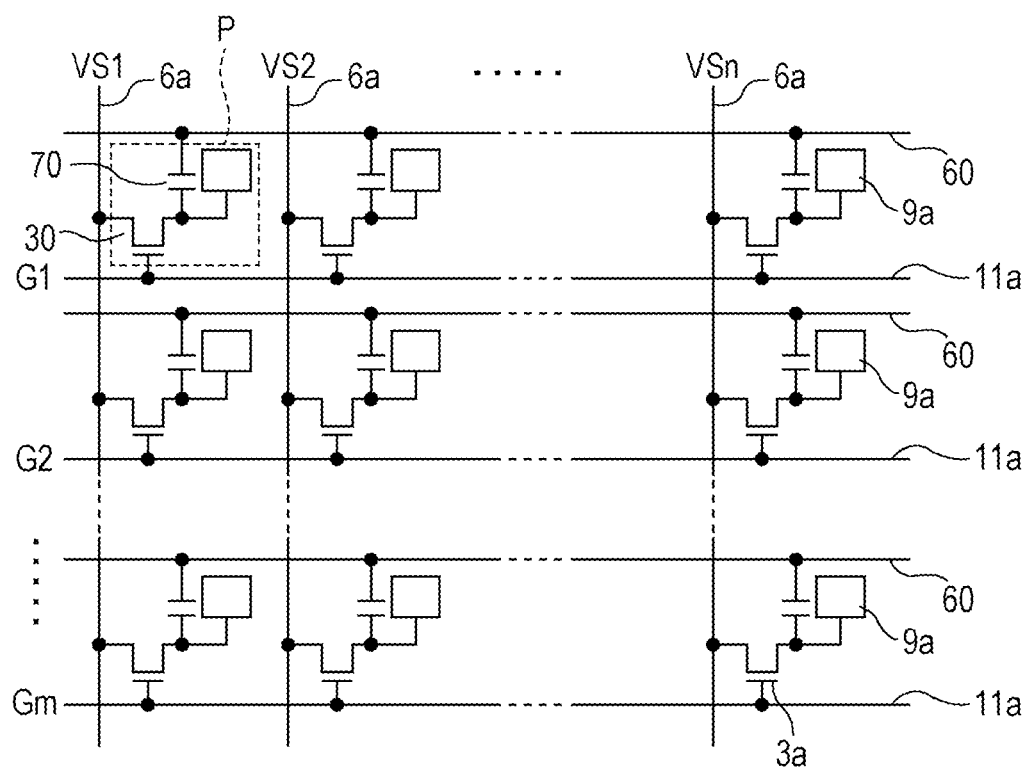
FIG. 4 is an equivalent circuit diagram of an area where pixels are disposed, according to embodiment 1.

First, the whole configuration of the liquid crystal device 100 according to this embodiment, which is an example of an electro-optic device, will be described with reference to FIGS. 1 to 4. FIG. 1 is a schematic plan view illustrating a configuration of the liquid crystal device. FIG. 2 is a schematic cross-sectional view taken along the line II-II of FIG. 1. FIG. 3 is a circuit diagram illustrating a configuration of main circuits of the liquid crystal device. FIG. 4 is an equivalent circuit diagram of an area where pixels are disposed.

As shown in FIGS. 1 and 2, the liquid crystal device 100 includes an element substrate 10 and an opposing substrate 20 which are disposed opposite to each other, a liquid crystal layer 50 interposed between a pair of these substrates, and the like.

The element substrate 10 is larger than the opposing substrate 20 and these substrates are bonded to each other via a seal material 52 which is disposed in a frame shape. Further, these substrates are provided with liquid crystal having positive or negative dielectric anisotropy and being sealed in a gap between the substrates, and this liquid crystal forms the liquid crystal layer 50. The seal material 52 is an adhesive material, such as a heat-hardening type epoxy resign or an ultraviolet-hardening type epoxy resign, and incorporates a spacer (not illustrated) for keeping a distance between the pair of substrates constant.

The seal material 52, which is disposed in a frame shape, is provided at the inner side thereof with a light shielding film 53 which is likewise disposed in a frame shape. The light shielding film 53 is made of, for example, a metallic material having a light shielding property, a metallic compound or the like, and the inner portion of the light shielding film 53 forms a display area E. The display area E is provided therein with a plurality of pixels P which are disposed in a matrix shape.

There is provided a data line driving circuit 101 between a first side of the element substrate 10, along which a plurality of external circuit connection terminals 102 are arranged, and a portion of the seal material 52 along the first side. There is provided a sampling circuit 7 between the display area E and the portion of the seal material 52 along the first side. There are provided two scanning line driving circuits 104 in their respective corresponding two areas, one being located between the display area E and a portion of the seal material 52 along a second side of the element substrate 10, the other one being located between the display area E and a portion of the seal material 52 along a third side of the element substrate 10, the second side and the third side being each orthogonal to the first side and being opposite to each other. There are provided wirings 105 for electrically connecting between the two scanning line driving circuits 104 in an area between the display area E and a portion of the seal material 52 along a fourth side opposite the first side. Moreover, there are provided routing wirings 90 for electrically connecting the data line driving circuit 101, the sampling circuit 7 and one of the scanning line driving circuits 104 to relevant ones of the external circuit connection terminals 102.

As shown in FIG. 2, the element substrate 10 includes a substrate body 10a, the TFTs 30 and pixel electrodes 9a which are formed on a liquid-crystal-layer-50 side face of the substrate body 10a, an alignment film 18 covering the pixel electrodes 9a, and the like. The substrate body 10a is made of a transparent material, such as a quartz material or a glass material. Further, the TFT 30 and the pixel electrode 9a are constituent elements of each of the pixels P. Details of the pixel P will be described below.

Moreover, although illustrated in FIG. 2, the element substrate 10 is provided thereon with a static electricity protection circuit 300 (refer to FIG. 3), which will be described below, besides the data line driving circuit 101, the sampling circuit 7 and the scanning line driving circuits 104. In addition to these circuits, there may be provided a semiconductor circuit, such as an inspection circuit for inspecting qualities, defects and the like of the liquid crystal device 100 in the process of manufacturing and/or before shipment.

The opposing substrate 20 includes an opposing substrate body 20a as well as the light shielding film 53, an insulating film 22, an opposing electrode 23, an alignment film 24 and the like which are laminated in order on a liquid-crystal-layer-50 side face of the opposing substrate body 20a.

The opposing substrate body 20a is made of a transparent material, such as a quartz material or a glass material.

As shown in FIG. 1, the light shielding film 53 overlaps the sampling circuit 7, the scanning line driving circuits 104 and the like when seen from a planar view, and has a role of shielding light inputting from an opposing-substrate-20 side to prevent malfunctions of these circuits due to the light. Further, the light shielding film 53 ensures high contrast in the display of the display area E by preventing unnecessary stray light from inputting to the display area E.

The insulating film 22, which is made of an inorganic material, such as a silicon dioxide material, has optical transparency, and is provided so as to cover the light shielding film 53. Further, the insulating film 22 also functions as a planarization layer for relieving unevenness which is caused on the substrate by providing the light shielding film 53.

The opposing electrode 23, which is formed of a transparent conductive film, such as an ITO film, covers the insulating film 22, and is formed across the display area E. As shown in FIG. 1, the opposing electrode 23 is electrically connected to element-substrate-10 side wirings through upper/lower conducting portions 106 each provided at a corresponding one of four corners of the opposing substrate 20.

The alignment film 18 covering the pixel electrodes 9a and the alignment film 24 covering the opposing electrode 23 are set on the basis of an optical design for the liquid crystal device 100. The alignment film 18 and the alignment film 24 are formed of an oblique evaporated film (i.e., an inorganic alignment film) made of an inorganic material, such as a silicon dioxide material, and may be realized by employing an organic alignment film made of a polyimide material or the like.

As shown in FIG. 3, the scanning line driving circuit 104 is supplied with the electric potential of a low electric potential power supply VSSY and the electric potential of a high electric potential power supply VDDY from an external circuit via corresponding ones of the external circuit connection terminals 102, and scanning line driving circuit power supply wirings 94. The electric potential of the low electric potential power supply VSSY is a ground potential (a reference potential), that is, approximately 0 volt. The electric potential of the high electric potential power supply VDDY is higher than that of the low electric potential power supply VSSY, and is approximately 16 volt. Moreover, one of the scanning line driving circuits 104 is supplied with a Y clock signal CLY (together with an inverted Y clock signal CLYB) and a Y start pulse signal DY from an external circuit via corresponding ones of the external circuit connection terminals 102, and scanning line driving circuit signal wirings 95. The scanning line driving circuit 104 sequentially generates and outputs scanning signals G1, G2 . . . , and Gm on the basis of these signals.

The data line driving circuit 101 is supplied with the electric potential of a low electric potential power supply VSSX and the electric potential of a high electric potential power supply VDDX from an external circuit via corresponding ones of the external circuit connection terminals 102, and data line driving circuit power supply wirings 91. The electric potential of the low electric potential power supply VSSX is a ground potential (a reference potential), that is, approximately 0 volt. The electric potential of the high electric potential power supply VDDX is higher than that of the low electric potential power supply VSSX, and is approximately 16 volt. Moreover, the data line driving circuit 101 is supplied with an X clock signal CLX (together with an inverted X clock signal CLXB) and an X start pulse signal DX from an external circuit via corresponding ones of the external circuit connection terminals 102, and data line driving circuit signal wirings 92. Upon input of the X start pulse signal DX, the data line driving circuit 101 sequentially generates and outputs sampling signals S1, S2, . . . , and Sn at timing based on the X clock signal CLX (together with the inverted X clock signal XCLXB).

The sampling circuit 7 includes a plurality of sampling switches 7s each being composed of a single channel type TFT of p channel type or n channel type, or a complementary type TFT. The sampling circuit 7 is supplied with electric potentials of image signals VID1 to VID6 via corresponding ones of the external circuit connection terminals 102, and image signal lines 96. Moreover, the sampling circuit 7 is supplied with the sampling signals S1, S2, . . . , and Sn each associated with a corresponding one of the sampling switches 7s from the data line driving circuit 101. Upon input of the sampling signals S1, S2, . . . , and Sn, the sampling circuit 7 sequentially supplies data lines 6a corresponding to the sampling switches 7s with image signals in accordance with the sampling signals S1, S2, . . . , and Sn.

As shown in FIG. 4, in an area where the pixels P are arranged (i.e., in the display area E), there are provided a plurality of scanning lines 11a and a plurality of data lines 6a, which are two groups of signal lines, being electrically insulated from each other and being orthogonally intersected with each other, as well as a plurality of capacitance lines 60 extending in parallel with the plurality of scanning lines 11a. In each of areas partitioned by the data lines 11a and the data lines 6a, there are provided the pixel electrode 9a, the TFT 30 and a storage capacitance 70, and these elements constitute a pixel circuit of the pixel P.

The data line 6a, through which an image signal is supplied, is electrically connected to the source electrode of the TFT 30. Image signals VS1, VS2, . . . , and VSn, each to be written into a corresponding one of the data lines 6a, may be line-sequentially supplied to the data lines 6a in this order, or may be supplied thereto for each group consisting of two or more adjacent ones of the data lines 6a. In this embodiment, the image signals VS1, VS2, . . . , and VSn are supplied to the data lines 6a for each group consisting of six data lines 6a each associated with a corresponding one of image signals VID1 to VID6 resulting from serial-to-parallel converting the image signals VS1, VS2, . . . , and VSn into six phases of image signals. The number of phases of converted image signals (that is, the number of a group of image signals resulting from a serial-to-parallel conversion) is not limited to the six phases, and the configuration may be made such that converted image signals of plural phases, such as nine phases, twelve phases or twenty-four phases, are supplied to a group of data lines 6a whose number is made equal to the number of phases of the converted image signals.

The scanning line 11a, through which a scanning signal is supplied, is electrically connected to a gate electrode 3a of the TFT 30. The scanning lines 11a and the gate electrodes 3a are line-sequentially supplied with scanning signals G1, G2, . . . , and Gm in this order. The pixel electrode 9a is electrically connected to a drain electrode of the TFT 30.

The liquid crystal device 100 is configured such that, upon input of each of the scanning signals G1, G2, . . . , and Gm, a corresponding row of TFTs 30 each functioning as a switching element are made in on-state during only a constant period, and via the row of TFTs 30, the image signals VS1, VS2, . . . , and VSn, each supplied from a corresponding one of the data lines 6a, are written into corresponding pixel electrodes 9a at a given timing point. Moreover, the image signals VS1, VS2, . . . , and VSn, which have been written into the corresponding pixel electrodes 9a, are written into corresponding liquid crystal layers 50, and further, are each retained between a corresponding pixel electrode 9a and the opposing electrode 23, which is disposed opposite the pixel electrode 9a via a corresponding liquid crystal layer 50, during a predetermined period.

In order to prevent each of the retained image signals VS1, VS2, . . . , and VSn from leaking, a corresponding storage capacitor 70 is added in parallel with liquid crystal capacitance which is formed between a corresponding pixel electrode 9a and the opposing electrode 23. This storage capacitor 70 is provided between the drain of a corresponding TFT 30 and a corresponding capacitance line 60.

The liquid crystal device 100 configured in such a way as described above is a transparent type device, and is configured in an optical design so as to operate in a normally white mode in which a transmission factor of the pixel P when not supplied with a voltage is larger than a transmission factor of the pixel P when supplied with a voltage, so that its display becomes bright, or in a normally black mode in which a transmission factor of the pixel P when not supplied with a voltage is smaller than a transmission factor of the pixel P when supplied with a voltage, so that its display becomes dark. A polarization element (not illustrated) is provided at each of a light input side and a light output side in accordance with an optical design.

Wiring and Static Electricity Protection Circuit

Next, let us return to FIG. 3, and the outline of wirings provided on the element substrate 10 of the liquid crystal device 100, as well as positions at each of which the static electricity protection circuit 300 is provided, and the like, will be described.

The liquid crystal device 100 includes the image signal lines 96 for supplying the sampling circuit 7 with the image signals VID1 to VID6; the scanning line driving circuit power supply wirings 94 for supplying the scanning line driving circuit 104 with electric power; the scanning line driving circuit signal wirings 95 for supplying the scanning line driving circuit 104 with driving signals; the data line driving circuit 101 for supplying the data line driving circuit 101 with electric power; the data line driving circuit signal wirings 92 for supplying the data line driving circuit 101 with driving signals, and the like. These wirings constitute the routing wirings 90 (refer to FIG. 1) for connecting between the external circuit connection terminals 102 and semiconductor circuits (the data line driving circuit 101, the sampling circuit 7, the scanning line driving circuit 104 and the like).

As described above, the scanning line driving circuit power supply wirings 94 are supplied with the electric potential (0 volt) of the low electric potential power supply VSSY and the electric potential (approximately 16 volt) of the high electric potential power supply VDDY. The data line driving circuit power supply wirings 91 are supplied with the electric potential (0 volt) of the low electric potential power supply VSSX and the electric potential (approximately 16 volt) of the high electric potential power supply VDDX. As a result, the electric potential of the scanning line driving circuit power supply wiring 94 supplied with the electric potential of the high electric potential power supply VDDY and the data line driving circuit power supply wiring 91 supplied with the electric potential of the high electric potential power supply VDDX are higher than the electric potential of the scanning line driving circuit power supply wiring 94 supplied with the electric potential of the low electric potential power supply VSSY and the data line driving circuit power supply wiring 91 supplied with the electric potential of the low electric potential power supply VSSX.

The scanning line driving circuit power supply wiring 94 supplied with the low electric potential power supply VSSY (0 volt) and the data line driving circuit power supply wiring 91 supplied with the low electric potential power supply VSSX (0 volt) are examples of "a first power supply wiring" according to an application example of the invention, and will be referred to as low electric potential power supply wirings VSS hereinafter. The scanning line driving circuit power supply wiring 94 supplied with the high electric potential power supply VDDY (approximately 16 volt) and the data line driving circuit power supply wiring 91 supplied with the high electric potential power supply VDDX (approximately 16 volt) are examples of "a second power supply wiring" according to an application example of the invention, and will be referred to as high electric potential power supply wirings VDD hereinafter.

As described above, the scanning line driving circuit signal wirings 95 are supplied with the Y clock signal CLY (together with the inverted Y clock signal CLYB), the Y start pulse signal DY and the like. The data line driving circuit signal wirings 92 are supplied with the X clock signal CLX (together with the inverted X clock signal CLXB), the X start pulse signal DX and the like. The image signal lines 96 are supplied with the image signals VID1 to VID6. The electric potentials of these signals, that is, the Y clock signal CLY, the inverted Y clock signal CLYB, the Y start pulse signal DY, the X clock signal CLX, the inverted X clock signal CLXB, the X start pulse signal DX and the image signals VID1 to VID6 are each within a range from the electric potential (0 volt) of the low electric potential power supply wiring VSS up to the electric potential (approximately 16 volt) of the high electric potential power supply wiring VDD.

The scanning line driving circuit signal wirings 95 supplied with the Y clock signal CLY (together with the inverted Y clock signal CLYB), the Y start pulse signal DY and the like, the data line driving circuit signal wirings 92 supplied with the X clock signal CLX (together with the inverted X clock signal CLXB), the X start pulse signal DX and the like, and the image signal lines 96 supplied with the image signals VID1 to VID6 are examples of "a signal wiring" according to an application example of the invention, and will be referred to as signal wiring S hereinafter.

In addition, an amount of an electric current flowing through each of the high electric potential power supply wiring VDD and the low electric potential power supply wiring VSS is larger than an amount of an electric current flowing through the signal wiring S, and thus, the width of each of the high electric potential power supply wiring VDD and the low electric potential power supply wiring VSS is larger (wider) than the width of the signal wiring S. That is, the resistance of each of the high electric potential power supply wiring VDD and the low electric potential power supply wiring VSS is lower than the resistance of the signal wiring S, and further, the capacitance of each of the high electric potential power supply wiring VDD and the low electric potential power supply wiring VSS is larger than the capacitance of the signal wiring S.

The static electricity protection circuits 300 are provided on (connected to) the signal wirings S between the semiconductor circuits (the data line driving circuit 101, the sampling circuit 7 and the scanning line driving circuit 104) and corresponding ones of the external circuit connection terminals 102. Although illustration is omitted in FIG. 3, the static electricity protection circuits 300 are also provided on (connected to) the low electric potential power supply wirings VSS and the high electric potential power supply wirings VDD, in addition to the signal wirings S.

Configuration of Pixel

Figure 5:
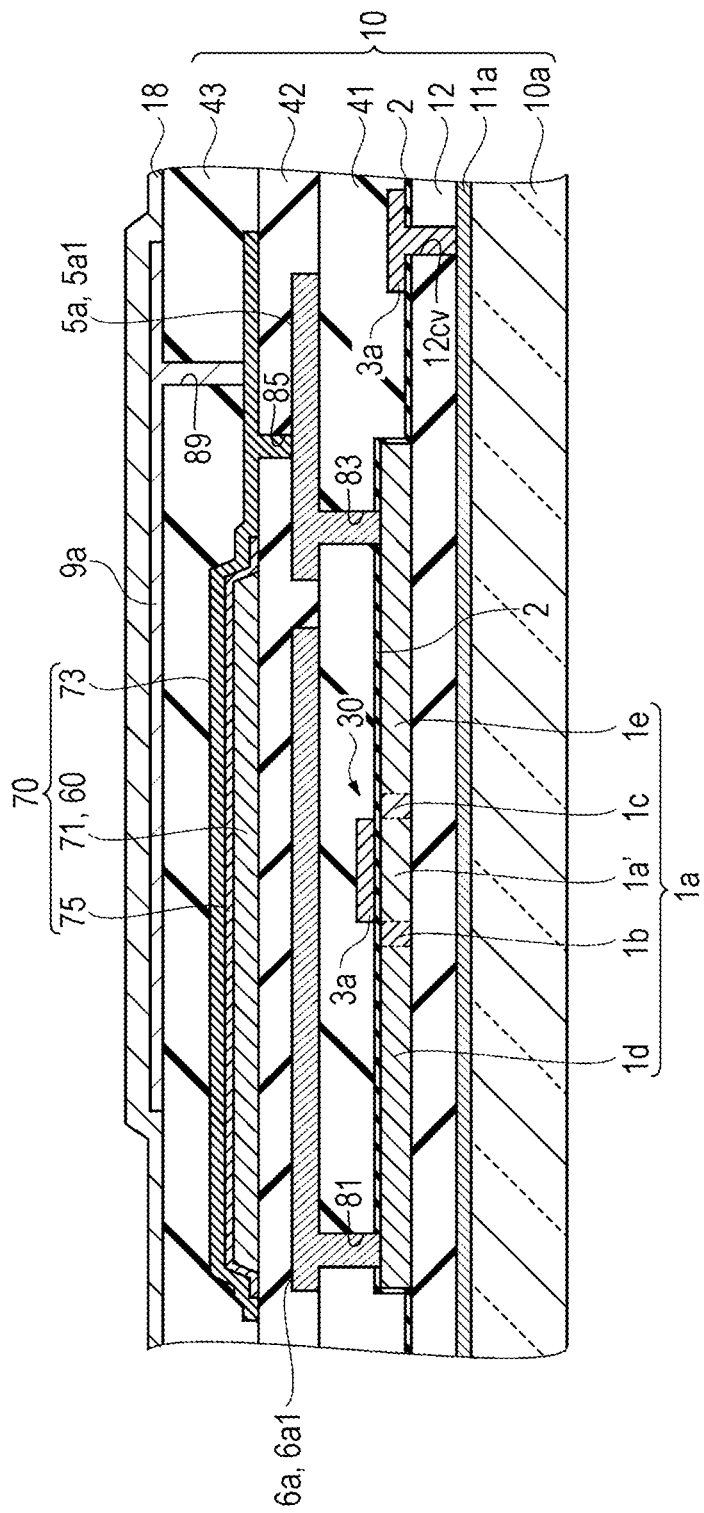
FIG. 5 is a schematic cross-sectional view illustrating cross-sectional location relations among individual constituent elements constituting a pixel, according to embodiment 1.

Next, a specific configuration of the pixel P which is disposed in the display area E will be described with reference to FIG. 5. FIG. 5 is a schematic cross-sectional view illustrating cross-sectional location relations among individual constituent elements constituting a pixel, and is illustrated on a scale sufficiently large for clear comprehension.

As shown in FIG. 5, the pixel P includes five layers laminated in order on the substrate body 1a: a first layer including the scanning lines 11a and the like; a second layer including the TFTs 30 and the like; a third layer including the data lines 6a and the like; a fourth layer including the storage capacitors 70 and the like; and a fifth layer (a top layer) including the pixel electrodes 9a, the alignment film 18 and the like. There are provided a ground insulating film 12 between the first layer and the second layer; a first inter-layer insulating film 41 between the second layer and the third layer; a second inter-layer insulating film 42 between the second layer and the third layer; and a third inter-layer insulating film 43 between the fourth layer and the fifth layer, and these insulating films prevent the above-mentioned elements from being short-circuited by one other.

Configuration of First Layer—Scanning Lines, Etc.—

In the first layer, there is provided the scanning lines 11a each made of a tungsten silicide material. As a material forming the scanning line 11a, besides the tungsten silicide material, for example, a titanium nitride material, a tungsten material or the like can be employed. The scanning lines 11a, each having a light shielding property, shield light inputting to the TFTs 30 from the lower side thereof, and thereby suppress false operation of the TFTs 30 due to the light.

Configuration of Second Layer—TFT, Etc.—

Next, in the second layer, there are provided the TFTs 30 each including the gate electrode 3a. The TFT 30 includes the gate electrode 3a made of a conductive polysilicon material and a tungsten silicide material; a semiconductor layer 1a made of a polysilicon material; and a gate insulating film 2 being made of a silicon dioxide material and insulating between the gate electrode 3a and the semiconductor layer 1a. The semiconductor layer 1a includes a highly concentrated source area 1d; a channel area 1a', a highly concentrated drain area 1e; a junction area (a lowly concentrated source area 1b) formed between the highly concentrated source area 1d and the channel area 1a'; and a junction area (a lowly concentrated drain area 1c) formed between the channel area 1a' and the highly concentrated drain area 1e. The gate insulating film 2 is provided so as to cover the semiconductor layer 1a and the ground insulating film 12. Further, the gate electrode 3a is disposed opposite the channel area 1a' of the semiconductor layer 1a so as to interpose the gate insulating film 2 between the channel area 1a' and itself.

Configuration Between First Layer and Second Layer—Ground Insulating Film, Etc.—

There is provided a ground insulating film 12 made of a silicon oxide material between the scanning line 11a and the semiconductor layer 1a. A portion of the ground insulating film 12, which is not contacted with the semiconductor layer 1a, is covered by the gate insulating film 2. There is provided a contact hole 12cv in the ground insulating film 12 formed on the scanning line 11a, and the gate insulating film 2 formed on the ground insulating film 12. The gate electrode 3a is provided so as to fill in the contact hole 12cv, and the gate electrode 3a and the scanning line 11a are electrically connected to each other through this contact hole 12cv, and have the same electrical potential.

Configuration of Third Layer—Data Line, Etc.—

In the third layer, there are provided the data line 6a (a source electrode 6a1) and a relay electrode 5a (a drain electrode 5a1). The data line 6a and the relay electrode 5a are each made of a conductive material, such as a metallic material, and have a two-layer structure including, for example, a layer formed of an aluminum material and a layer formed of a titanium nitride material. The data line 6a and the source electrode 6a1 are integrally formed, and a portion constituting the TFT 30 and being contacted with the highly concentrated source area 1d forms the source electrode 6a1. The relay electrode 5a and the drain electrode 5a1 are integrally formed, and a portion constituting the TFT 30 and being contacted with the highly concentrated drain area 1e forms the drain electrode 5a1.

Configuration Between Second Layer and Third Layer— First Inter-Layer Insulating Film—

There is provided a first inter-layer insulating film 41 made of, for example, a silicon dioxide material or a silicon nitride material between the gate electrode 3a and the data line 6a. In the first inter-layer insulating film 41, there are provided a contact hole 81 for electrically connecting between the highly concentrated source area 1d and the source electrode 6a1 which are included in the TFT 30, and a contact hole 83 for electrically connecting between the highly concentrated drain area 1e and the drain electrode 5a1 which are included in the TFT 30.

Configuration of Fourth Layer—Storage Capacitor, Etc.—

In the fourth layer, there is provided the storage capacitor 70. The storage capacitor 70 includes an upper electrode 73 being electrically connected to the pixel electrode 9a and functioning as a pixel electric potential side capacitance electrode; a lower electrode 71 functioning as a fixed electric potential side capacitance electrode; a dielectric layer 75 interposed between the upper electrode 73 and the lower electrode 71; and the like. This storage capacitor 70 makes it possible to remarkably improve the electric potential retention property of the pixel electrode 9a.

The upper electrode 73 is made of a conductive material, such as a metallic material, and has a function of relay-connecting between the pixel electrode 9a and the relay electrode 5a. The upper electrode 73 is electrically connected to the pixel electrode 9a via a contact hole 89, and is electrically connected to the highly concentrated drain area 1e of the TFT 30 via a contact hole 85, the relay electrode 5a and a contact hole 83.

The lower electrode 71 is made of a conductive material, such as a metallic material, and has a two-layer structure of, for example, a layer formed of an aluminum material and a layer formed of a titanium nitride material. The main line portion of the lower electrode 71 is extended in a direction towards a position where the scanning line 11a is disposed, and forms the capacitance line 60. That is, the lower electrode 71 and the capacitance line 60 have the same electric potential (a fixed electric potential).

As the dielectric layer 75, there can be used a single layer film made of, for example, a silicon nitride material, a silicon oxide material, a hafnium oxide material, an aluminum oxide material, a tantalum oxide material or the like, or a multi-layer film including at least two kinds of these single layer films laminated therein.

Configuration Between Third Layer and Fourth Layer— Second Inter-Layer Insulating Film—

There is provided the second inter-layer insulating film 42 made of, for example, a silicon nitride material or a silicon oxide material between the storage capacitor 70 and each of the data line 6a and the relay electrode 5a. In the second inter-layer insulating film 42, there is provided the contact hole 85 for electrically connecting between the relay electrode 5a and the upper electrode 73.

Configuration of Fifth Layer and Configuration Between Fourth Layer and Fifth Layer—Pixel Electrode, Etc.—

In the fifth layer, there is provided the pixel electrode 9a. The pixel electrode 9a is formed in an island shape for each of the pixels P, and is provided thereon with the alignment film 18. Further, there is provided the third inter-layer insulating film 43 made of, for example, a silicon nitride material or a silicon oxide material between the pixel electrode 9a and the storage capacitor 70. In the third inter-layer insulating film 43, there is provided a contact hole 89 for electrically connecting between the pixel electrode 9a and the upper electrode 73.

In addition, the aforementioned semiconductor circuits (the data line driving circuit 101, the sampling circuit 7, the scanning line driving circuits 104 and the like) and the aforementioned static electricity protection circuit 300 have the same structure as the structure of the aforementioned pixel P, and are formed in the same process (in the same opportunity) as that for the pixel P.

Outline of Static Electricity Protection Circuit

Figure 6:
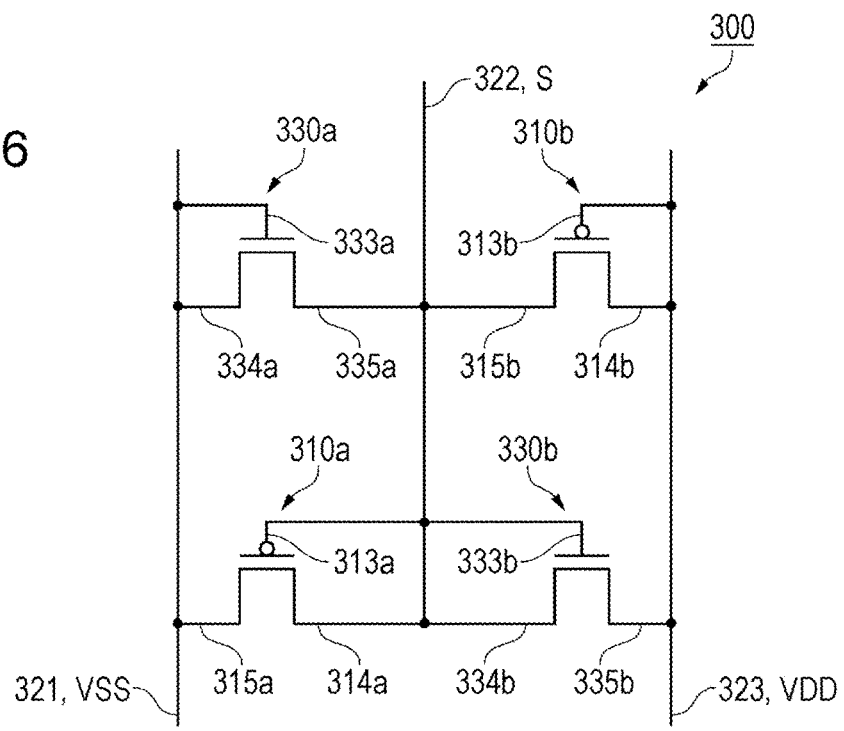
FIG. 6 is a circuit diagram of a static electricity protection circuit according to embodiment 1.
Figure 7:
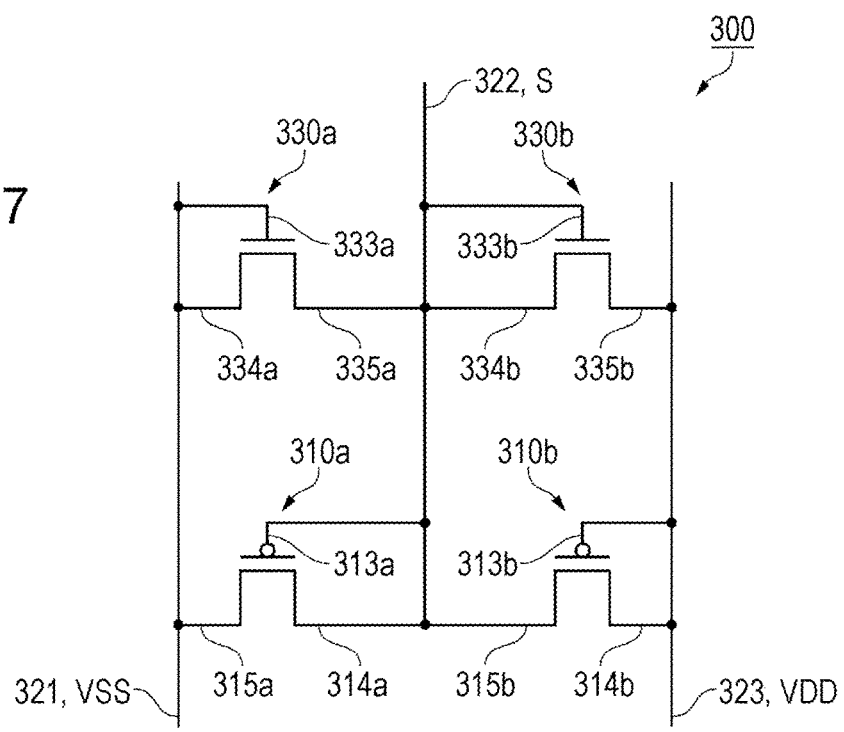
FIG. 7 is a circuit diagram of a static electricity protection circuit according to embodiment 1.

FIGS. 6 and 7 are circuit diagrams of a static electricity protection circuit. The outline of the static electricity protection circuit 300 will be described with reference to FIGS. 6 and 7.

As shown in FIG. 6, the static electricity protection circuit 300 includes a first p-type transistor 310a, a first n-type transistor 330a, a second p-type transistor 310b, a second n-type transistor 330b, a first wiring 321, a second wiring 322 and a third wiring 323.

The first wiring 321 is electrically connected to the low electric potential power supply wiring VSS, and is supplied with the electric potential (approximately 0 volt) of the low electric potential power supply VSS. The second wiring 322 is electrically connected to the signal wiring S, and is supplied with the electric potential of the signal wiring S. The third wiring 323 is electrically connected to the high electric potential power supply wiring VDD, and is supplied with the electric potential (approximately 16 volt) of the high electric potential power supply VDD. Thus, the electric potential supplied to the third wiring 323 is higher than that supplied to the first wiring 321. Further, the electric potential of the signal wiring S, which is supplied to the second wiring 322, is within a range between the electric potential (approximately 0 volt) of the low electric potential power supply wiring VSS and the electric potential (approximately 16 volt) of the high electric potential power supply wiring VDD, and thus, the electric potential of the first wiring 321, the electric potential of the second wiring 322 and the electric potential of the third wiring become higher in this order.

In other words, the first wiring 321 is the low electric potential power supply wiring VSS; the second wiring 322 is the signal wiring S; and the third wiring 323 is the high electric potential power supply wiring VDD. As described above, the width of the high electric potential power supply wiring VDD and the width of the low electric potential power supply wiring VSS are larger than that of the signal wiring S, and the capacitance of the high electric potential power supply wiring VDD and the capacitance of the low electric potential power supply wiring VSS are larger than that of the signal wiring S. Thus, the capacitance of the first wiring 321 and the capacitance of the third wiring 323 are larger than that of the second wiring 322.

Figure 8:
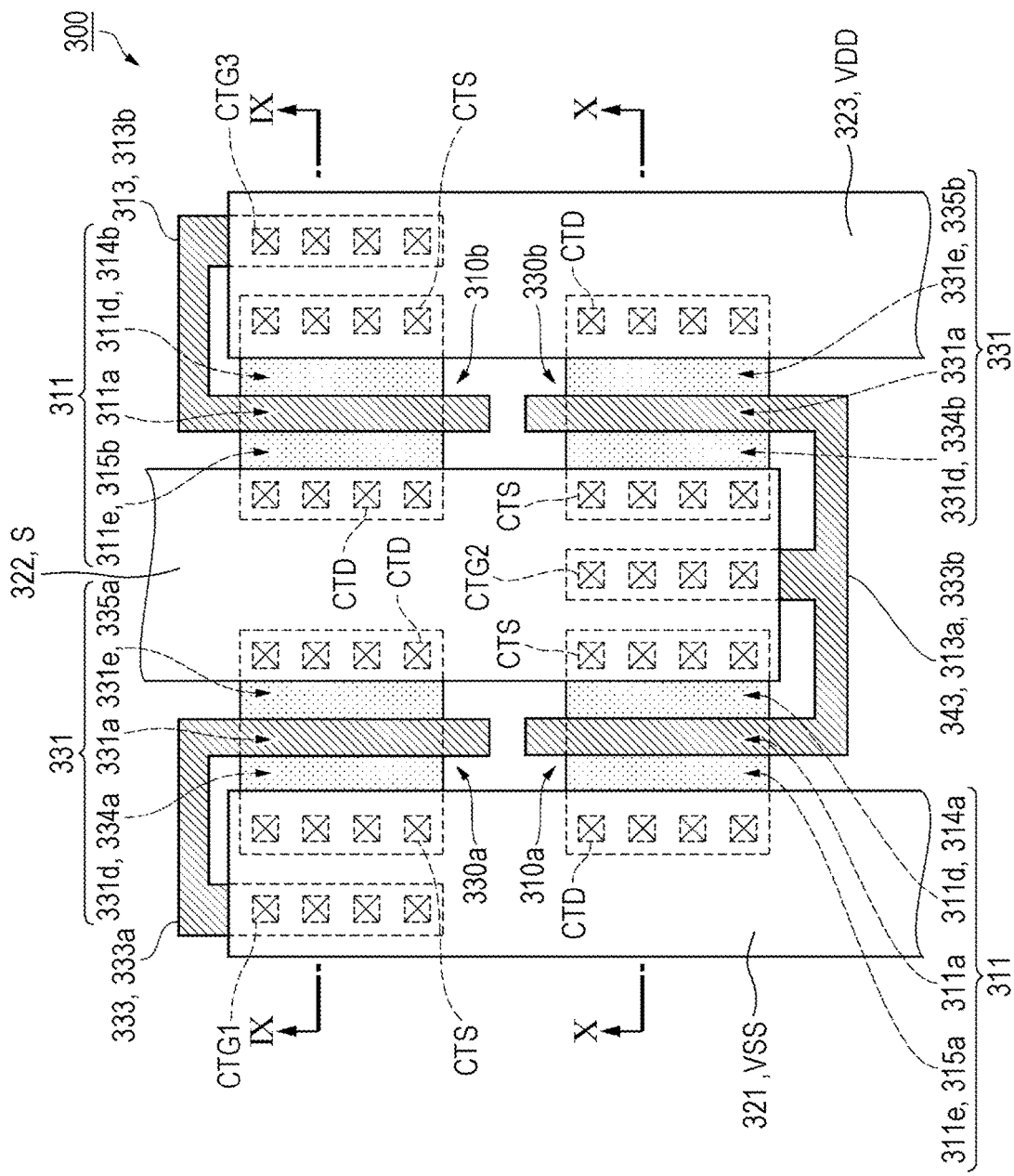
FIG. 8 is a schematic plan view of a static electricity protection circuit according to embodiment 1.

In the static electricity protection circuit 300, the first p-type transistor 310a, the second n-type transistor 330b, the second p-type transistor 310b and the first n-type transistor 330a are each disposed in a rectangular shape (refer to FIG. 8). The first p-type transistor 310a and the first n-type transistor 330a are each disposed along a direction in which the second wiring 322 is extended, and are each connected to the first wiring 321 and the second wiring 322. The second n-type transistor 330b and the second p-type transistor 310b are each disposed along a direction in which the second wiring 322 is extended, and are each connected to the second wiring 322 and the third wiring 323. Further, the first p-type transistor 310a and the second n-type transistor 330b are located opposite to each other with the second wiring 322 therebetween, and the first n-type transistor 330a and the second p-type transistor 310b are located opposite to each other with the second wiring 322 therebetween.

In addition, in the static electricity protection circuit 300, the p-type transistors 310a and 310b and the n-type transistors 330a and 330b may be located at their respective positions shown in FIG. 7. When describing in detail, the configuration may be made such that the first p-type transistor 310a and the second p-type transistor 310b are located opposite to each other with the second wiring 322 therebetween; the first n-type transistor 330a and the second n-type transistor 330b are located opposite to each other with the second wiring 322 therebetween, and the first p-type transistor 310a, the second p-type transistor 310b, the second n-type transistor 330b and the first n-type transistor 330a are each disposed in a rectangular shape.

In each of the p-type transistors 310a and 310b, a higher electric potential side electrode becomes a source and a lower electric potential side electrode forms a drain. Although there is a case where the electric potential of the second wiring 322 varies due to static electricity, in the following description, in the first p-type transistor 310a, an electrode connected to a higher electric potential side wiring (the second wiring 322) will be referred to as a source 314a and an electrode connected to a lower electric potential side wiring (the first wiring 321) will be referred to as a drain 315a. In the second p-type transistor 310b, an electrode connected to a higher electric potential side wiring (the third wiring 323) will be referred to as a source 314b and an electrode connected to a lower electric potential side wiring (the second wiring 322) will be referred to as a drain 315b.

In each of the n-type transistors 330a and 330b, a lower electric potential side electrode becomes a source and a higher electric potential side electrode forms a drain. Although there is a case where the electric potential of the second wiring 322 varies due to static electricity, in the following description, in the first n-type transistor 330a, an electrode connected to a lower electric potential side wiring (the first wiring 321) will be referred to as a source 334a and an electrode connected to a higher electric potential side wiring (the second wiring 322) will be referred to as a drain 335a. In the second n-type transistor 330b, an electrode connected to a lower electric potential side wiring (the second wiring 322) will be referred to as a source 334b and an electrode connected to a higher electric potential side wiring (the third wiring 323) will be referred to as a drain 335b.

The drain 315a of the first p-type transistor 310a, a gate 333a of the first n-type transistor 330a and the source 334a of the first n-type transistor 330a are electrically connected to the first wiring 321.

In addition, the drain 315a of the first p-type transistor 310a is an example of "one of a source and a drain of a first p-type transistor" according to an application example of the invention. The source 334a of the first n-type transistor 330a is an example of "one of a source and a drain of a first n-type transistor" according to an application example of the invention.

A gate 313a of the first p-type transistor 310a, the source 314a of the first p-type transistor 310a, the drain 335a of the first n-type transistor 330a, the drain 315b of the second p-type transistor 310b, a gate 333b of the second n-type transistor 330b and the source 334b of the second n-type transistor 330b are each electrically connected to the second wiring 322.

In addition, the source 314a of the first p-type transistor 310a is an example of "one of a source and a drain of a first p-type transistor" according to an application example of the invention. The source 335a of the first n-type transistor 330a is an example of "one of a source and a drain of a first n-type transistor" according to an application example of the invention. The drain 315b of the second p-type transistor 310b is an example of "one of a source and a drain of a second p-type transistor" in the aspect of the invention. The source 334b of the second n-type transistor 330b is an example of "one of a source and a drain of a second n-type transistor" according to an application example of the invention.

The gate 313b of the second p-type transistor 310b, the source 314b of the second p-type transistor 310b and the drain 335b of the second n-type transistor 330b are each electrically connected to the third wiring 323.

In addition, the source 314b of the second p-type transistor 310b is an example of "one of a source and a drain of a second p-type transistor" according to an application example of the invention. The drain 335b of the second n-type transistor 330b is an example of "one of a source and a drain of a second n-type transistor" according to an application example of the invention.

In this way, in the first p-type transistor 310a, the gate 313a and the source 314a are electrically connected to the second wiring 322, and have the same electric potential. In the first n-type transistor 330a, the gate 333a and the source 334a are electrically connected to the first wiring 321, and have the same electric potential. In the second p-type transistor 310b, the gate 313b and the source 314b are electrically connected to the third wiring 323, and have the same electric potential. In the second n-type transistor 330b, the gate 333b and the source 334b are electrically connected to the second wiring 322, and have the same electric potential. As a result, in the p-type transistor 310a, the resistance of a channel area 311a of the semiconductor layer 311 (refer to FIG. 8) varies due to the electric potential of the gate 313b relative to that of the drain 315a; and in the p-type transistor 310b, the resistance of a channel area 311a of the semiconductor layer 311 (refer to FIG. 8) varies due to the electric potential of the gate 315b relative to that of the drain 315b. In the n-type transistor 330a, the resistance of a channel area 331a of the semiconductor layer 331 (refer to FIG. 8) varies due to the electric potential of the gate 333a relative to that of the drain 335a; and in the n-type transistor 330b, the resistance of a channel area 331a of the semiconductor layer 331 (refer to FIG. 8) varies due to the electric potential of the gate 333b relative to that of the drain 335b.

Configuration of Static Electricity Protection Circuit

Figure 9:
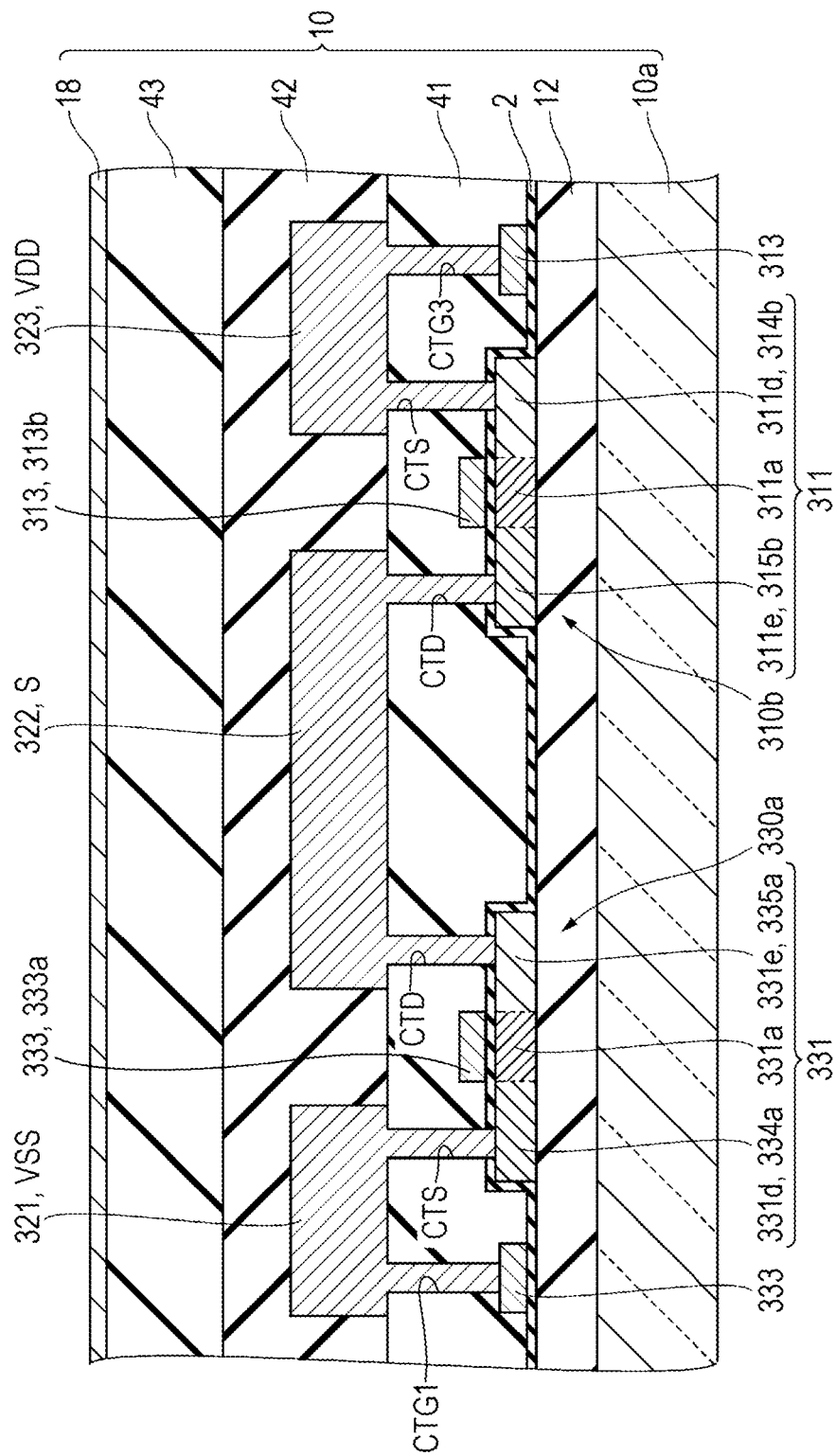
FIG. 9 is a schematic cross-sectional view taken along the line IX-IX of FIG. 8.
Figure 10:
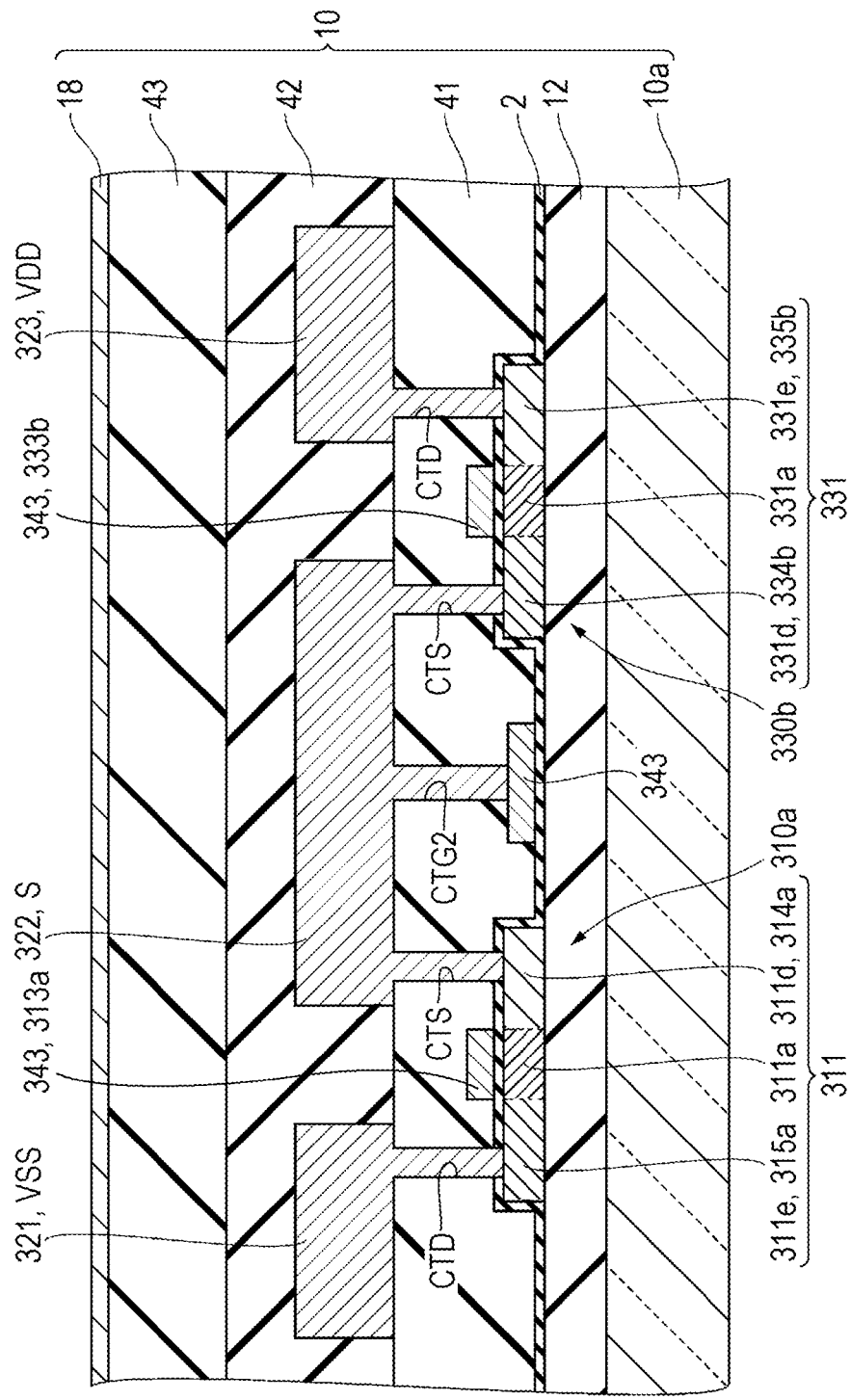
FIG. 10 is a schematic cross-sectional view taken along the line X-X of FIG. 8.

FIG. 8 is a schematic plan view of a static electricity protection circuit; FIG. 9 is a schematic cross-sectional view taken along the line IX-IX of FIG. 8; and FIG. 10 is a schematic cross-sectional view taken along the line X-X of FIG. 8.

A configuration of the static electricity protection circuit 300 will be specifically described with reference to FIGS. 8 to 10.

First, a planar configuration of the static electricity protection circuit 300 will be described with reference to FIG. 8.

As shown in FIG. 8, the first n-type transistor 330a and the second p-type transistor 310b are disposed along the line IX-IX. The first p-type transistor 310a and the second n-type transistor 330b are disposed along the line X-X.

In the first p-type transistor 310a, the semiconductor layer 311, which is formed in a rectangular shape, includes a highly concentrated drain area 311e, the channel area 311a and a highly concentrated source area 311d, and the highly concentrated drain area 311e and the highly concentrated source area 311d form the drain 315a and the source 314a, respectively. A portion of the highly concentrated drain area 311e overlaps the first wiring 321, and a contact hole CTD is disposed in the overlapped portion. A portion of the highly concentrated source area 311d overlaps the second wiring 322, and a contact hole CTS is disposed in this overlapped portion. A gate electrode 343 is disposed so as to overlap the channel area 311a of the semiconductor layer 311 included in the first p-type transistor 310a, and the channel area 331a of the semiconductor layer 331 included in the second n-type transistor 330b. The gate electrode 343 included in a portion overlapped with the channel area 311a of the semiconductor layer 311 forms the gate 313a. The gate electrode 343 has a W-shape, and is configured so as not to overlap the highly concentrated source area 311d of the first p-type transistor 310a and the highly concentrated source area 331d of the second n-type transistor 330b. A contact hole CTG 2 is disposed in a portion where the gate electrode 343 and the second wiring 322 are overlapped with each other.

In the first n-type transistor 330a, the semiconductor layer 331, which is formed in a rectangular shape, includes a highly concentrated drain area 331e, the channel area 331a and a highly concentrated source area 331d, and the highly concentrated drain area 331e and the highly concentrated source area 331d form the drain 335a and the source 334a, respectively. A portion of the highly concentrated source area 331d overlaps the first wiring 321, and a contact hole CTS is disposed in this overlapped portion. A portion of the highly concentrated drain area 331e overlaps the second wiring 322, and a contact hole CTD is arranged in this overlapped portion. The gate electrode 333 is disposed so as to overlap the channel area 331a of the semiconductor layer 331 and the first wiring 321. The gate electrode 333 included in a portion overlapped with the channel area 331a of the semiconductor layer 331 forms the gate 333a. The gate electrode 333 has a U-shape, and is configured so as not to overlap the highly concentrated source area 331d. A contact hole CTG1 is disposed in a portion where the gate electrode 333 and the first wiring 321 are overlapped with each other.

In the second p-type transistor 310b, the semiconductor layer 311, which is formed in a rectangular shape, includes a highly concentrated drain area 311e, the channel area 311a and a highly concentrated source area 311d, and the highly concentrated drain area 311e and the highly concentrated drain area 311d form the drain 315a and the source 314b, respectively. A portion of the highly concentrated drain area 311e overlaps the second wiring 322, and a contact hole CTD is disposed in this overlapped portion. A portion of the highly concentrated source area 311d overlaps the third wiring 323, and a contact hole CTS is disposed in this overlapped portion. The gate electrode 313 is disposed so as to overlap the channel area 311a of the semiconductor layer 311 and the third wiring 323. The gate electrode 313 included in a portion overlapped with the channel area 311a of the semiconductor layer 311 forms the gate 313b. The gate electrode 313 has a U-shape, and is configured so as not to overlap the highly concentrated source area 311d. A contact hole CTG 3 is disposed in a portion where the gate electrode 313 and the third wiring 323 are overlapped with each other.

In the second n-type transistor 330b, the semiconductor layer 331, which is formed in a rectangular shape, includes a highly concentrated drain area 331e, the channel area 331a and a highly concentrated source area 331d, and the highly concentrated drain area 331e and the highly concentrated source area 331d form the drain 335b and the source 334b, respectively. A portion of the highly concentrated source area 331d overlaps the second wiring 322, and a contact hole CTS is disposed in this overlapped portion. A portion of the highly concentrated drain area 331e overlaps the third wiring 323, and a contact hole CTD is disposed in this overlapped portion. The gate electrode 343 included in a portion overlapped with the channel area 331a of the semiconductor layer 331 forms the gate 333b.

In addition, in the semiconductor layer 311, there may be provided a junction area (a lowly concentrated source area) between the highly concentrated source area 311d and the channel area 311a, and there may be provided a junction area (a lowly concentrated drain area) between the highly concentrated drain area 311e and the channel area 311a. In the semiconductor layer 331, there may be provided a junction area (a lowly concentrated source area) between the highly concentrated source area 331d and the channel area 331a, and there may be provided a junction area (a lowly concentrated drain area) between the highly concentrated drain area 331e and the channel area 331a.

Further, although, in the static electricity protection circuit 300 shown in FIG. 8, the first wiring 321 is disposed at the left side of the second wiring 322 and the third wiring 323 is disposed at the right side of the second wiring 322, the configuration may be made such that the first wiring 321 is disposed at the right side of the second wiring 322 and the third wiring 323 is disposed at the left side of the second wiring 322.

Next, a cross-sectional configuration of the static electricity protection circuit 300 will be described with reference to FIGS. 9 and 10.

As described above, the p-type transistors 310a and 310b and the n-type transistors 330a and 330b which constitute the static electricity protection circuit 300 are formed in the same process (in the same opportunity) as that for the pixel P, and are each made of the same material as that of the pixel P.

As shown in FIGS. 9 and 10, the semiconductor layers 331 and the semiconductor layers 311, which are provided on the ground insulating film 12 covering the substrate body 10a, are covered by the gate insulating film 2. There are provided the gate electrodes 313, 333 and 343, which are formed in the same process as that for the gate electrode 3a, on the gate insulating film 2. A portion of the gate electrode 313, which is disposed opposite one of the semiconductor layers 311 via the gate insulating film 2, forms the gate 313b; and a portion of the gate electrode 343, which is disposed opposite the other one of the semiconductor layers 311 via the gate insulating film 2, forms the gate 313a. Further, a portion of the gate electrode 333, which is disposed opposite one of the semiconductor layers 331 via the gate insulating film 2, forms the gate 333a; and a portion of the gate electrode 343, which is disposed opposite the other one of the semiconductor layers 331 via the gate insulating film 2, forms the gate 333b. The gate electrode 313, 333 and 343 and the gate insulating film 2 are covered by the first inter-layer insulating film 41. There are provided the wirings 321, 322 and 323, which are formed in the same process as that for the data line 6a and the relay electrode 5a, on the first inter-layer insulating film 41. The second inter-layer insulating film 42, the third inter-layer insulating film 43 and the alignment film 18 are laminated in this order on the wirings 321, 322 and 323.

As shown in FIG. 9, the first n-type transistor 330a and the second p-type transistor 310b are disposed along the line IX-IX. The first n-type transistor 330a includes the semiconductor layer 331 (the highly concentrated source area 331d, the channel area 331a and the highly concentrated drain area 331e); the gate insulating film 2; and the gate electrode 333 (the gate 333a) which is disposed opposite the channel area 331a. The second p-type transistor 310b includes the semiconductor layer 311 (the highly concentrated drain area 311e, the channel area 311a and the highly concentrated source area 311d); the gate insulating film 2; and the gate electrode 313 (the gate 313b) which is disposed opposite the channel area 311a.

In the first n-type transistor 330a, there is formed the contact hole CTG1 for exposing the gate electrode 333 in the first inter-layer insulating film 41, and there are formed the contact hole CTS for exposing the highly concentrated source area 331d and the contact hole CTD for exposing the highly concentrated drain area 331e in the gate insulating film 2 and the first inter-layer insulating film 41. The gate electrode 333 (the gate 333a) and the highly concentrated source area 331d (the source 334a) are electrically connected to each other via the contact hole CTG1, the first wiring 321 and the contact hole CTS. That is, the first wiring 321, the gate 333a and the source 334a have the same electric potential.

In the second p-type transistor 310b, there is formed the contact hole CTG3 for exposing the gate electrode 313 in the first inter-layer insulating film 41, and there are formed the contact hole CTD for exposing the highly concentrated drain area 311e and the contact hole CTS for exposing the highly concentrated source area 311d in the gate insulating film 2 and the first inter-layer insulating film 41. The gate electrode 313 (the gate 313b) and the highly concentrated source area 311d (the source 314b) are electrically connected to each other via the contact hole CTG3, the third wiring 323 and the contact hole CTS. That is, the third wiring 323, the gate 313b and the source 314b have the same electric potential.

The highly concentrated drain area 331e (the drain 335a) of the first n-type transistor 330a and the highly concentrated drain area 311e of the second p-type transistor 310b are electrically connected to each other via the two contact holes CTD and the second wiring 322. That is, the second wiring 322, the drain 335a of the first n-type transistor 330a and the drain 315b of the second p-type transistor 310b have the same electric potential.

As shown in FIG. 10, the first p-type transistor 310a and the second n-type transistor 330b are disposed along the line X-X. The first p-type transistor 310a includes the semiconductor layer 311 (the highly concentrated drain area 311e, the channel area 311a and the highly concentrated source area 311d), the gate insulating film 2, and the gate electrode 343 (the gate 313a) which is disposed opposite the channel area 311a. The second n-type transistor 330b includes the semiconductor layer 331 (the highly concentrated source area 331d, the channel area 331a and the highly concentrated drain area 331e), the gate insulating film 2, and the gate electrode 343 (the gate 333b) which is disposed opposite the channel area 331a.

In the first p-type transistor 310a, there is formed the contact hole CTG2 for exposing the gate electrode 343 in the first inter-layer insulating film 41, and there are formed the contact hole CTD for exposing the highly concentrated drain area 311e and the contact hole CTS for exposing the highly concentrated source area 311d in the gate insulating film 2 and the first inter-layer insulating film 41. The gate electrode 343 (the gate 313a) and the highly concentrated source area 311d (the source 314b) are electrically connected to each other via the contact hole CTG2, the second wiring 322 and the contact hole CTS. The highly concentrated drain area 311e (the drain 315a) and the first wiring 321 are electrically connected to each other via the contact hole CTD. That is, the drain 315a and the first wiring 321 have the same electric potential.

In the second n-type transistor 330b, there are formed the contact hole CTS for exposing the highly concentrated source area 331d and the contact hole CTD for exposing the highly concentrated drain area 331e in the gate insulating film 2 and the first inter-layer insulating film 41. The gate electrode 343 (the gate 333b) and the highly concentrated source area 331d (the source 334b) are electrically connected to each other via the contact hole CTG2, the second wiring 322 and the contact hole CTS. The highly concentrated drain area 331e (the drain 335b) and the third wiring 323 are electrically connected to each other via the contact hole CTD. That is, the drain 335b and the third wiring 323 have the same electric potential.

Moreover, the gate 313a and the source 314a of the first p-type transistor 310a and the gate 333b and the source 334b of the second n-type transistor 330b are electrically connected to one another via the second wiring, and have the same electric potential.

Operation of Static Electricity Protection Circuit

FIGS. 11 to 14 are circuit diagrams corresponding to the circuit diagram of a static electricity protection circuit, shown in FIG. 6, and illustrate flows of charges caused by static electricity. In each of FIGS. 11 to 14, the flow of charges caused by static electricity is denoted by dashed lines.

Hereinafter, the operation of the static electricity protection circuit 300 and the flow of charges caused by static electricity when the static electricity has influenced the individual wirings 321, 322 and 323 will be described with reference to FIGS. 11 to 14.

As described above, when the liquid crystal device 100 is in an operation state, the first wiring 321 is supplied with the electric potential (approximately 0 volt) of the low electric potential power supply wiring VSS; the second wiring 322 is supplied with the electric potential (approximately 0 to 16 volt) of the signal wiring S; and the third wiring 323 is supplied with the electric potential (approximately 16 volt) of the high electric potential power supply wiring VDD. When these electric potentials are supplied, the first p-type transistor 310a becomes in off-state (in a non-conducting state) because the gate 313a has a positive electric potential relative to the electric potential of the drain 315a; the first n-type transistor 330a becomes in off-state (in a non-conducting state) because the gate 333a has a negative electric potential relative to the electric potential of the drain 335a; the second p-type transistor 310b becomes in off-state (in a non-conducting state) because the gate 313b has a positive electric potential relative to the electric potential of the drain 315b; and the second n-type transistor 330b becomes in off-state (in a non-conducting state) because the gate 330b has a negative electric potential relative to the electric potential of the drain 335b. That is, all of the first p-type transistor 310a, the first n-type transistor 330a, the second p-type transistor 310b and the second n-type transistor 330b become in off-state (in a non-conducting state), the first wiring 321 (the low electric potential power supply wiring VSS), the second wiring 322 (the signal wiring S) and the third wiring 323 (the high electric potential power supply wiring VDD) have no mutual electric interference, and thus, the liquid crystal device 100 normally operates.

As described above, when the electric potential of the first wiring 321, the electric potential of the second wiring 322 and the electric potential of the third wiring 323 become higher in this order, each of all the p-type transistors 310a and 310b and n-type transistors 330a and 330b, which are disposed in the static electricity protection circuit 300, becomes in a non-conducting state. When, in, for example, an electro-optic device including semiconductor circuits or an electronic device including semiconductor circuits, there exist three kinds of wirings having such an electric-potential relation, there occurs no interference among the three kinds of wirings even if the static electricity protection circuit 300 is provided on (connected to) the three kinds of wirings. That is, the static electricity protection circuit 300 does not influence the operation of the electro-optic device or the electronic device, and thus, the electro-optic device or the electronic device normally operates.

Further, the influence of the static electricity on the electro-optic device or the electronic device is reduced by the static electricity protection circuit 300, and a non-recoverable electrostatic damage (electrostatic destruction) on semiconductor circuits mounted in the electro-optic device or the electronic device becomes unlikely to occur. Further description will be made in detail below.

When the liquid crystal device 100 is in a non-operation state, the first wiring (the low electric potential power supply wiring VSS), the second wiring 322 (the signal wiring S) and the third wiring 323 (the high electric potential power supply wiring VDD) become in a floating state in which their respective electric potentials are uncertain. For example, when positive charges PC are caused on the second wiring 322 by static electricity (that is, when positive static electricity influences the second wiring 322), the second wiring 322 has a positive electric potential relative to the electric potential of the first wiring 321 and that of the third wiring 323. When negative charges NC are caused on the second wiring 322 by static electricity (that is, when negative static electricity influences the second wiring 322), the second wiring 322 has a negative electric potential relative to the electric potential of the first wiring 321 and that of the third wiring 323.

Figure 11:
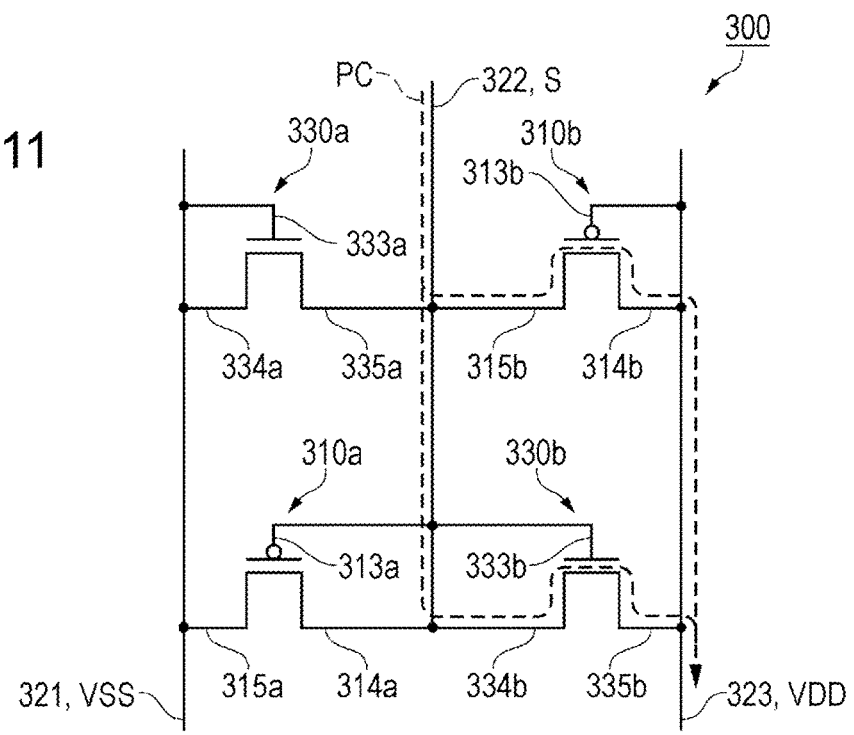
FIG. 11 is a circuit diagram illustrating a flow of charges caused by static electricity, according to embodiment 1.

FIG. 11 illustrates a flow of the positive charges PC caused on the second wiring 322 (the signal wiring S) by static electricity when the liquid crystal device 100 is in a non-operation state.

In FIG. 11, the positive charges PC are caused on the second wiring 322 (the signal wiring S) by static electricity, transistors' gates, drains and sources connected to the second wiring 322 have a positive electric potential relative to the electric potential of the first wiring 321 and that of the third wiring 323, wherein the transistors' gates, drains and sources connected to the second wiring 322 are the gate 313a and the source 314a of the first p-type transistor 310a, the drain 335a of the first n-type transistor 330a, the drain 315b of the second p-type transistor 310b, the gate 333b and the source 334b of the second n-type transistor 330b.

For this reason, the gate 313a has a positive electric potential relative to the electric potential of the drain 315a, and thus, the first p-type transistor 310a becomes in off-state (in a non-conducting state). The gate 333a has a negative electric potential relative to the electric potential of the drain 335a, and thus, the first n-type transistor 330a becomes in off-state (in a non-conducting state). The gate 313b has a negative electric potential relative to the electric potential of the drain 315b, and thus, the second p-type transistor 310b becomes in on-state (in a conducting state). The gate 333b has a positive electric potential relative to the electric potential of the drain 335b, and thus, the second n-type transistor 330b becomes in on-state (in a conducting state). That is, when the positive charges PC are caused on the first wiring 321, the first p-type transistor 310a and the first n-type transistor 330a become in a non-conducting state, and the second p-type transistor 310b and the second n-type transistor 330b become in a conducting state. As a result, paths leading from the second wiring 322 (the signal wiring S) to the third wiring 323 (the high electric potential power supply wiring VDD) become in a conducting state, and the positive charges PC caused on the second wiring (the signal wiring S) by static electricity flow (distributed) to the third wiring 323 (the high electric potential power supply wiring VDD) via the second p-type transistor 310b and the second n-type transistor 330b.

Figure 12:
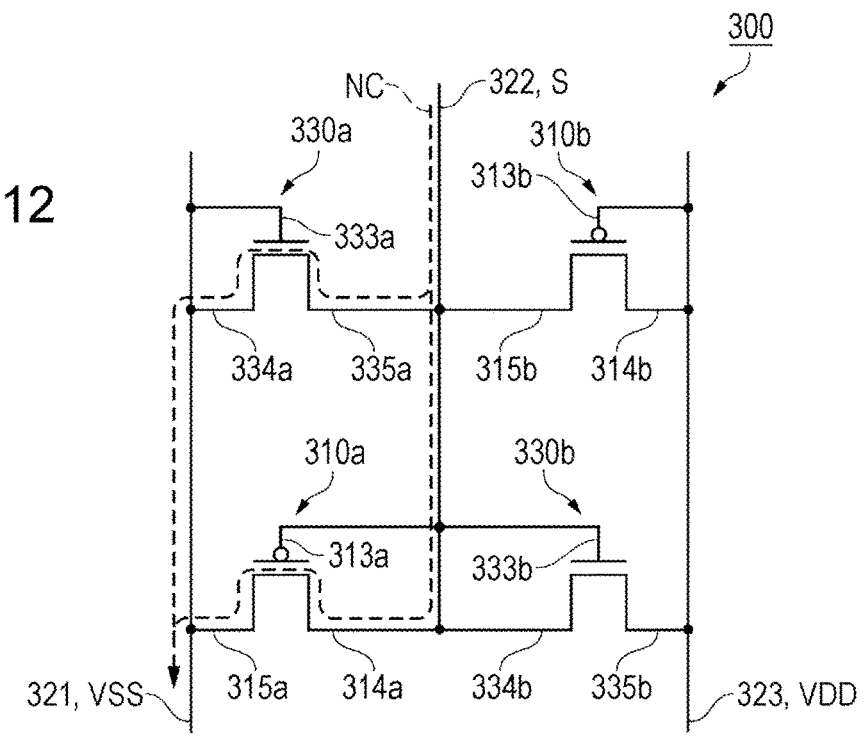
FIG. 12 is a circuit diagram illustrating a flow of charges caused by static electricity, according to embodiment 1.

FIG. 12 illustrates a flow of the negative charges NC caused on the second wiring 322 (the signal wiring S) by static electricity when the liquid crystal device 100 is in a non-operation state.

In FIG. 12, when the negative charges NC are caused on the second wiring 322 (the signal wiring S) by static electricity, transistors' gates, drains and sources connected to the second wiring 322 have a positive electric potential relative to the electric potential of the first wiring 321 and that of the third wiring 323, wherein the transistors' gates, drains and sources connected to the second wiring 322 are the gate 313a and the source 314b of the first p-type transistor 310a, the drain 335b of the first n-type transistor 330a, the drain 315b of the second p-type transistor 310b, the gate 333b and the source 334b of the second n-type transistor 330b.

For this reason, the gate 313a has a negative electric potential relative to the electric potential of the drain 315a, and thus, the first p-type transistor 310a becomes in on-state (in a conducting state). The gate 333a has a positive electric potential relative to the electric potential of the drain 335a, and thus, the first n-type transistor 330a becomes in on-state (in a conducting state). The gate 313b has a positive electric potential relative to the electric potential of the drain 315b, and thus, the second p-type transistor 310b becomes in off-state (in a non-conducting state). The gate 333b has a negative electric potential relative to the electric potential of the drain 335b, and thus, the second n-type transistor 330b becomes in off-state (in a non-conducting state). That is, when the negative charges NC are caused on the second wiring 322, the first p-type transistor 310a and the first n-type transistor 330a become in a conducting state, and the second p-type transistor 310b and the second n-type transistor 330b become in a non-conducting state. As a result, paths leading from the second wiring 322 (the signal wiring S) to the first wiring 321 (the low electric potential power supply wiring VSS) become in a conducting state, and the negative charges NC caused on the second wiring (the signal wiring S) by static electricity flow (are distributed) to the first wiring 321 (the low electric potential power supply wiring VSS) via the first p-type transistor 310a and the first n-type transistor 330a.

In this way, when the positive charges PC or the negative charges NC are caused on the second wiring 322 by static electricity, one of the two p-type transistors 310a and 310b and one of the two n-type transistors 330a and 330b become in a conducting state. The positive charges PC caused on the second wiring 322 by static electricity are distributed (discharged) to the third wiring 323 via a pair of the second p-type transistor 310b and the second n-type transistor 330b having become in a conducting state; and the negative charges NC caused on the second wiring 322 by static electricity are distributed (discharged) to the first wiring 321 via a pair of the first p-type transistor 310a and the first n-type transistor 330a having become in a conducting state.

Figure 16:
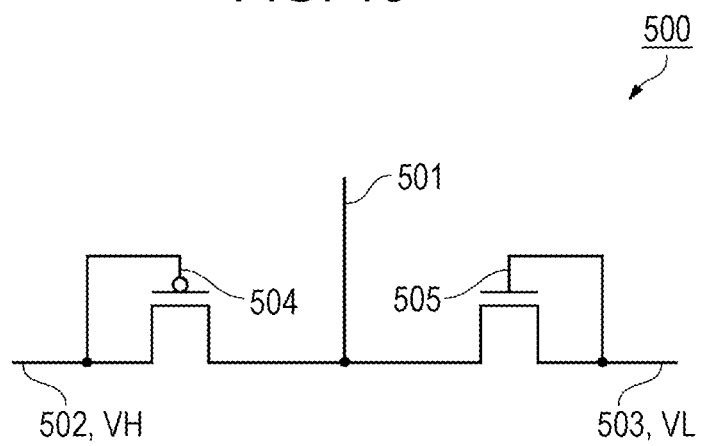
FIG. 16 is a circuit diagram illustrating a static electricity protection circuit according to a well-known technology.

Meanwhile, in the static electricity protection circuit 500, shown in FIG. 16, according to the well-known technology, one of the p-type transistor 504 and the n-type transistor 505 becomes in a conducting state due to charges caused by static electricity. Moreover, there is a difference in carrier mobility between the p-type transistor 504 and the n-type transistor 505, and in a case of the p-type transistor 504, charges (an electric current) are (is) harder to flow, as compared with a case of the n-type transistor 505. Thus, in the static electricity protection circuit 500, there is a difference in easiness of flowing of charges caused by static electricity between a case where the p-type transistor 504 becomes in a conducting state and a case where the n-type transistor 505 becomes in a conducting state. In other words, in the static electricity protection circuit 500, an asymmetric diversity occurs in discharge capability (electricity removal capability) on charges caused by static electricity between a case where positive charges are caused by static electricity and a case where negative charges are caused by static electricity.

In the static electricity protection circuit 300 according to this embodiment, regardless of the polarity of charges caused by static electricity, one of the two p-type transistors 310a and 310b and one of the two n-type transistors 330a and 330b become in a conducting state. That is, both of a p-type transistor and an n-type transistor become in a conducting state, and thus, an asymmetric diversity in discharge capability of the static electricity protection circuit 500 according to the well-known technology is eliminated, and positive charges or negative charges caused by static electricity can be stably distributed (discharged) to paths leading to the first wiring 321 or paths leading to the third wiring 323, whichever has become in a conducting state. Moreover, in the static electricity protection circuit 300 according to this embodiment, the number of the paths through which charges caused by static electricity flow is made larger, as compared with the case of the static electricity protection circuit 500 according to the well-known technology, and thus, charges caused by static electricity can be promptly distributed (discharged) to paths leading to the first wiring 321 or paths leading to the third wiring 323, whichever has become in a conducting state. Accordingly, in discharge capability (electricity removal capability) on charges caused by static electricity, the static electricity protection circuit 300 according to this embodiment is superior to the static electricity protection circuit 500 according to a publicly-known technology.

Furthermore, the capacitance of the first wiring 321 (the low electric potential power supply wiring VSS) and the capacitance of the third wiring 323 (the high electric potential power supply wiring VDD) are each larger than that of the second wiring 322 (the signal wiring S), and thus, a larger amount of the charges PC or NC can be distributed (discharged) from the second wiring 322 to paths leading to the first wiring 321 or paths leading to the third wiring 323, whichever has become in a conducting state.

Accordingly, as compared with the static electricity protection circuit 500 (FIG. 16) according to a publicly-known technology, in which one of the p-type transistor 504 and the n-type transistor 505 becomes in a conducting state, in the static electricity protection circuit 300 according to this embodiment, one of the two p-type transistors 310a and 310b and one of the two n-type transistors 330a and 330b become in a conducting state, and thus, the charges PC or NC caused by static electricity are more stably and more promptly distributed (discharged) from the second wiring 322 to paths leading to the first wiring 323 or paths leading to the third wiring 323, whichever has become in a conducting state, so that an amount of a variation of the electric potential of the second wiring 322 (the signal wiring S) due to static electricity can be made smaller. Accordingly, a non-recoverable electrostatic damage (electrostatic destruction) on the semiconductor circuits (the data line driving circuit 101, the sampling circuit 7, the scanning line driving circuit 104 and the like) connected to the signal line S becomes more unlikely to occur.

Figure 13:
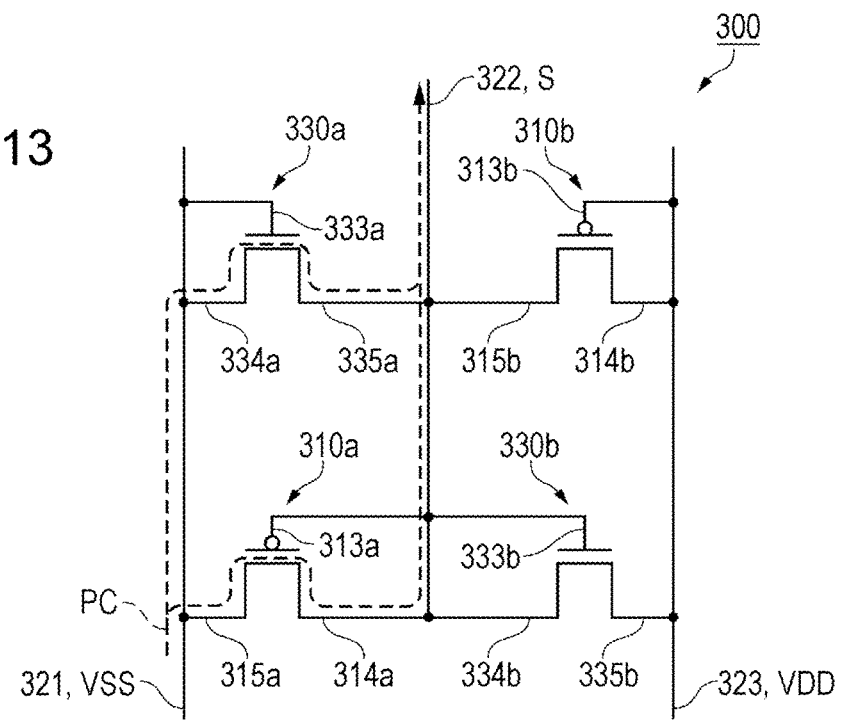
FIG. 13 is a circuit diagram illustrating a flow of charges caused by static electricity, according to embodiment 1.

FIG. 13 illustrates a flow of the positive charges PC caused on the first wiring 321 (the low electric potential power supply wiring VSS) by static electricity when the liquid crystal device 100 is in a non-operation state.

In FIG. 13, when the positive charges PC are caused on the first wiring 321 (the low electric potential power supply wiring VSS) by static electricity, the drain 315a of the first p-type transistor 310a, the gate 333a and the source 334b of the first n-type transistor 330a, these drain, gate and source being connected to the first wiring 321, have a positive electric potential relative to the electric potential of the second wiring 322.

For this reason, the gate 313a has a negative electric potential relative to the electric potential of the drain 315a, and thus, the first p-type transistor 310a becomes in on-state (in a conducting state). The gate 333a has a positive electric potential relative to the electric potential of the drain 335a, and thus, the first n-type transistor 330a becomes in on-state (in a conducting state). That is, when the positive charges PC are caused on the first wiring 321 (the low electric potential power supply wiring VSS) by static electricity, paths leading from the first wiring 321 (the low electric potential power supply wiring VSS) to the second wiring 322 (the signal wiring S) become in a conducting state, and the positive charges PC caused on the first wiring (the low electric potential power supply wiring VSS) by static electricity flow (are distributed) to the second wiring 322 (the signal wiring S) via the first p-type transistor 310a and the first n-type transistor 330a.

As compared with the static electricity protection circuit 500 (FIG. 16) according to a publicly-known technology, in which one of the p-type transistor 504 and the n-type transistor 505 becomes in a conducting state, in the static electricity protection circuit 300 according to this embodiment, both the first p-type transistor 310a and the first n-type transistor 330a become in a conducting state, and thus, the positive charges PC caused on the first wiring 321 (the low electric potential power supply wiring VSS) are more stably and more promptly distributed (discharged) to the second wiring 322 (the signal wiring S), so that an amount of a variation of the electric potential of the first wiring 321 (the low electric potential power supply wiring VSS) due to static electricity can be made smaller. Accordingly, a non-recoverable electrostatic damage (electrostatic destruction) on the semiconductor circuits (the data line driving circuit 101, the scanning line driving circuit 104 and the like) connected to the low electric potential power supply wiring VSS becomes more unlikely to occur.

Figure 14:
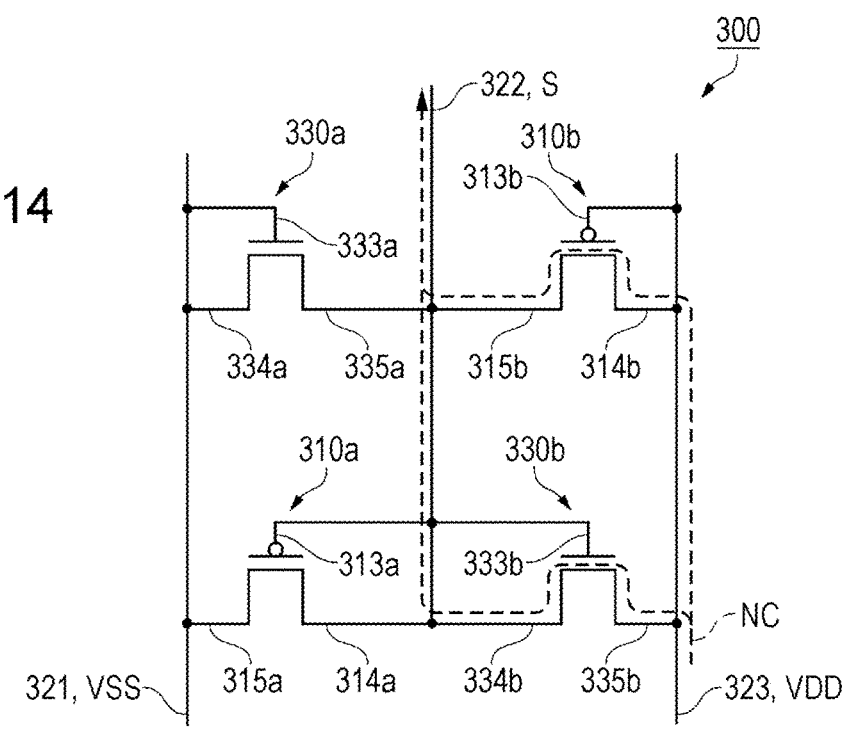
FIG. 14 is a circuit diagram illustrating a flow of charges caused by static electricity, according to embodiment 1.

FIG. 14 illustrates a flow of the negative charges NC caused on the third wiring 323 (the high electric potential power supply wiring VDD) by static electricity when the liquid crystal device 100 is in a non-operation state.

In FIG. 14, when the negative charges NC are caused on the third wiring 323 (the high electric potential power supply wiring VDD) by static electricity, the gate 313*b* and the source 314*b* of the second p-type transistor 310*b*, the drain 335*b* of the second n-type transistor 330*b*, these gate, source and drain being connected to the third wiring 323, have a negative electric potential relative to the electric potential of the second wiring 322.

For this reason, the gate 313*b* has a positive electric potential relative to the electric potential of the drain 315*b*, and thus, the second p-type transistor 310*b* becomes in on-state (in a conducting state). The gate 333*b* has a positive electric potential relative to the electric potential of the drain 335*b*, and thus, the second n-type transistor 330*b* becomes in on-state (in a conducting state). That is, when the negative charges NC are caused on the third wiring 323 (the high electric potential power supply wiring VDD) by static electricity, paths leading from the third wiring 323 (the high electric potential power supply wiring VSS) to the second wiring 322 (the signal wiring S) become in a conducting state, and the negative charges NC caused on the third wiring 323 (the high electric potential power supply wiring VDD) by static electricity flow (are distributed) to the second wiring 322 (the signal wiring S) via the second p-type transistor 310*b* and the second n-type transistor 330*b*.

As compared with the static electricity protection circuit 500 (FIG. 16) according to a publicly-known technology, in which one of the p-type transistor 504 and the n-type transistor 505 becomes in a conducting state, in the static electricity protection circuit 300 according to this embodiment, since both the second p-type transistors 310*b* and the second n-type transistor 330*b* become in a conducting state, the negative charges NC caused on the third wiring 323 (the high electric potential power supply wiring VDD) are more stably and more promptly distributed (discharged) to the second wiring 322 (the signal wiring S), so that an amount of a variation of the electric potential of the third wiring 323 (the high electric potential power supply wiring VDD) due to static electricity can be made smaller. Accordingly, a non-recoverable electrostatic damage (electrostatic destruction) on the semiconductor circuits (the data line driving circuit 101, the scanning line driving circuit 104 and the like) connected to the high electric potential power supply wiring VDD becomes more unlikely to occur.

Embodiment 2

Electronic Device

Figure 15:
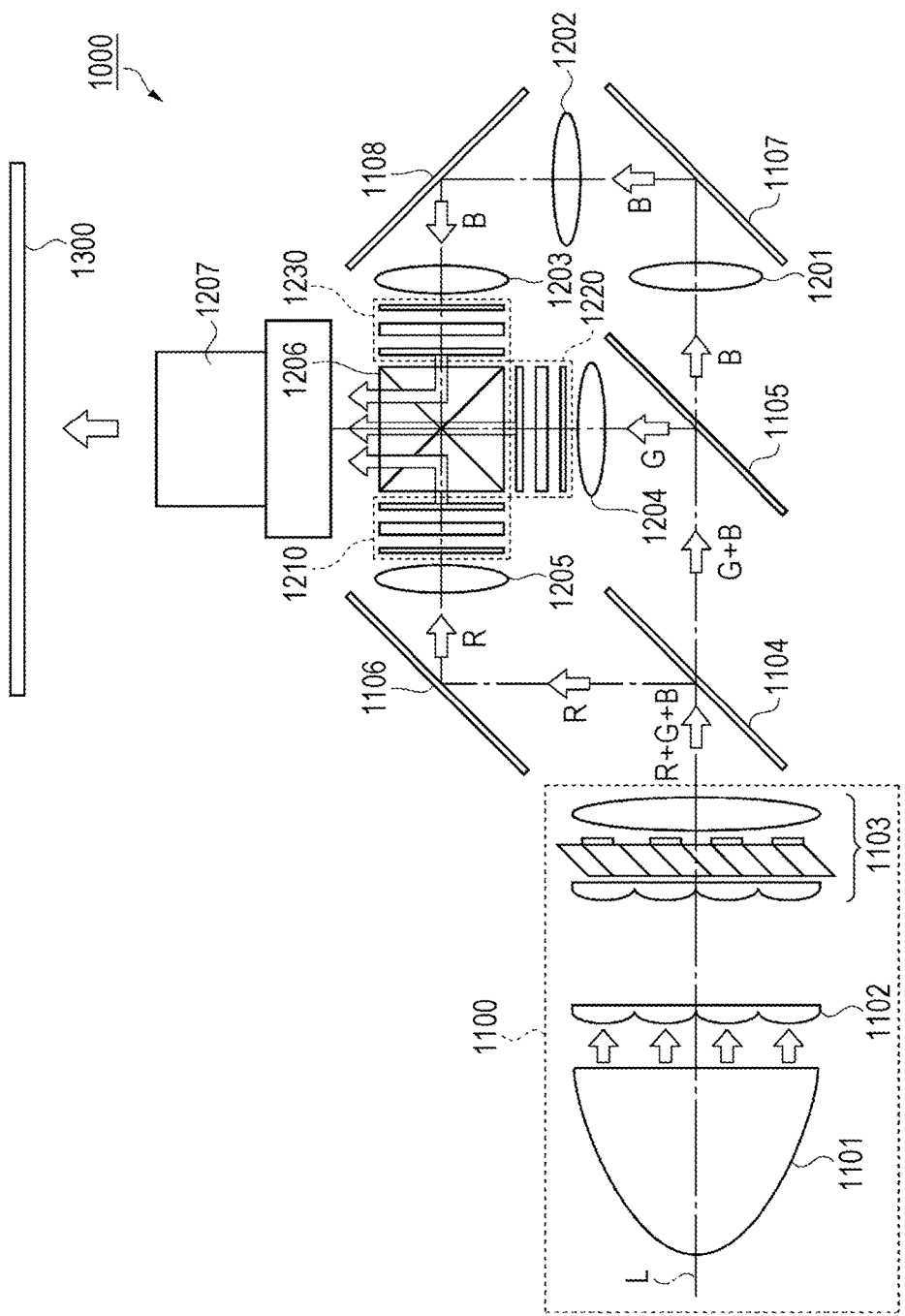
FIG. 15 is a schematic diagram illustrating a projection type display device according to embodiment 2.

FIG. 15 is a schematic diagram illustrating a configuration of a projection type display device (a liquid crystal projector) as an electronic device. As shown in FIG. 15, a projection type display device 1000 as an electronic device according to this embodiment includes a polarization luminaire 1100 disposed along a system light axis L; two dichroic mirrors 1104 and 1105 each as a light separation element; three reflection mirrors 1106, 1107 and 1108; five relay lenses 1201, 1202, 1203, 1204 and 1205; three transparent type liquid crystal light valves 1210, 1220 and 1230 each as a light modulation means; a cross-dichroic prism 1206 as a photosynthetic element; and a projection lens 1207.

The polarization luminaire 1100 is approximately constituted of a lamp unit 1101 functioning as a light source, and including a white light source, such as a supervoltage mercury lamp or a halogen lamp; an integrator lens 1102; and a polarization change element 1103.

With respect to red light rays (R), green light rays (G) and blue light rays (B) among polarized light rays irradiated from the polarization luminaire 1100, the dichroic mirror 1104 reflects the red light rays (R) and passes the green light rays (G) and the blue light rays (B) through itself. The dichroic mirror 1105, which is the other one of the two dichroic mirrors, reflects the green light rays (G), having passed through the dichroic mirror 1104, and passes the blue light rays (G), having passed through the dichroic mirror 1104, through itself.

The red light rays (R) having been reflected by the dichroic mirror 1104 are reflected by the reflection mirror 1106, and then, enter the liquid crystal light valve 1210 via the relay lens 1205.

The green light rays (G) having been reflected by the dichroic mirror 1105 enter the liquid crystal light valve 1220 via the relay lens 1204.

The blue light rays (B) having passed through the dichroic mirror 1105 enter the liquid crystal light valve 1230 via a light guiding system including the three relay lenses 1201, 1202 and 1203 and the two reflection mirrors 1107 and 1108.

The liquid crystal light valves 1210, 1220 and 1230 are each disposed opposite a corresponding one of input faces of the cross-dichroic prism 1206, each of the input faces being associated with a corresponding one of the three kinds of colored light rays. The three kinds of color light rays, each having entered a corresponding one of the liquid crystal light valves 1210, 1220 and 1230, are modulated on the basis of picture information (a picture signal), and are irradiated towards the cross-dichroic prism 1206. This prism includes four right-angle prisms which are bonded to one another, and inside the prism, a dielectric multi-film for reflecting the red light rays and a dielectric multi-film for reflecting the blue light rays are formed in a cross shape. The three kinds of colored light rays are synthesized by these dielectric multi-films, and as a result, light rays representing a color image are synthesized. The synthesized light rays are projected on a screen 1300 by the projection lens 1207, which is an optical system for projection, and as a result, an image is enlarged and displayed.

Each of the liquid crystal light valves 1210, 1220 and 1230 is provided therein with the aforementioned liquid crystal device 100 having been applied to the each liquid crystal light valve. The liquid crystal device 100 includes the static electricity protection circuit 300, and thus, the semiconductor circuits (the data line driving circuit 101, the sampling circuit 7, the scanning line driving circuits 104 and the like) become unlikely to be influenced by static electricity. Accordingly, the projection type display device 1000, to which the liquid crystal device is applied, is unlikely to be influenced by the static electricity, and has high reliability.

The invention is not limited to the aforementioned embodiments but is appropriately susceptible to modifications within a scope not departing from the gist or the thought of the invention readable from the claims and the whole of the specification, and a liquid crystal device involving such changes and an electronic device to which the liquid crystal device is applied are also included in the technical scope of the invention.

Besides the aforementioned embodiments, various modification examples can be considered. Hereinafter, description of some of the modification examples will be made.

Modification Example 1

The static electricity protection circuit 300 is not limited to application to a liquid crystal device, and can be applied to, for example, a light emitting device including an organic electroluminescence element. The static electricity protection circuit 300 enables provision of a high-reliability light emitting device which is unlikely to be influenced by static electricity.

Further, the static electricity protection circuit 300 may be applied to an electronic device including semiconductor circuits. For example, a static electricity protection circuit for an integrated circuit including a MOS transistor formed on a semiconductor substrate is also within the scope of the invention.

Modification Example 2

The protection of static electricity can be sufficiently achieved merely by connecting the static electricity protection circuit 300 to the first wiring 321, the second wiring 322 having a higher electric potential than that of the first wiring 321, and the third wiring 323 having a higher electric potential than that of the second wiring 322, and thus, in a liquid crystal device (an electro-optic device), the static electricity protection circuit 300 can be installed at any position where wirings supplied with such electric potentials exist.

Specifically, in embodiment 1, the static electricity protection circuits 300 are disposed on (connected to) the signal wirings S between corresponding ones of the external circuit connection terminals 102 and the semiconductor circuits (the data line driving circuit 101, the sampling circuit 7 and the scanning line driving circuits 104), but the locations of the static electricity protection circuits 300 are not limited to the above locations. For example, the static electricity protection circuits 300 can be disposed on (connected to) wirings inside the semiconductor circuits, and the static electricity protection circuits 300 can be also disposed on (connected to) wirings between the semiconductor circuits and the display area E.

Further, in embodiment 1, the first wiring 321 is made the low electric potential power supply wiring VSS, the second wiring 322 is made the signal wiring S and the third wiring 323 is made the high electric potential power supply wiring VDD, but the association of the first wiring 321, the second wiring 322 and the third wiring 323 with the low electric potential power supply wiring VSS, the signal wiring S and the third wiring 323 is not limited the above association. The association may be made such that, for example, among a plurality of signal wirings S, a first signal wiring S supplied with the lowest electric potential is made the above first wiring 321, a second signal wiring S supplied with the highest electric potential is made the above third wiring 323, and a third signal wiring S is made the above second wiring 322.

Modification Example 3

An electronic device to which the liquid crystal device according to embodiment 1 is applied is not limited to the projection type display device 1000 according to embodiment 2. For example, besides the projection type display device 1000, the liquid crystal device according to embodiment 1 can be applied to a projection type head-up display (HUD), a head-mounted display (HMD), an e-book, a personal computer, a digital still camera, a liquid crystal television set, a viewfinder type or a monitor direct-view type video recorder, a car navigation system, an information terminal device such as a POS, an electronic device such as an electronic diary, or the like Further, in an electronic device in which the static electricity protection circuit 300 according to embodiment 1 is mounted, the influence of static electricity is also restricted, so that high reliability can be achieved. That is, any electronic device provided with the static electricity protection device 300 and/or an electro-optic device including the static electricity protection device 300 makes it possible to restrict the influence of static electricity and realize high reliability.

What is claimed is:
1. An electro-optic device comprising:
a scanning line;
a data line;
a pixel;
a scanning line driving circuit; and
a static electricity protection circuit,
wherein the static electricity protection circuit includes
a first p-type transistor;
a first n-type transistor;
a second p-type transistor;
a second n-type transistor;
a first wiring line that supplies a first electric potential;
a second wiring line connected to the scanning line driving circuit; and
a third wiring line that supplies a second electric potential higher than the first electric potential,
wherein
the first p-type transistor is disposed between the first wiring line and the second wiring line, and a gate of the first p-type transistor and one of a source and a drain of the first p-type transistor are connected to the second wiring line,
the first n-type transistor is disposed between the first wiring line and the second wiring line, and a gate of the first n-type transistor and one of a source and a drain of the first n-type transistor are connected to the first wiring line,
the second p-type transistor is disposed between the third wiring line and the second wiring line, a gate of the second p-type transistor and one of a source and a drain of the second p-type transistor are connected, and the other one of the source and the drain of the second p-type transistor is connected to the second wiring line, and
the second n-type transistor is disposed between the third wiring line and the second wiring line, a gate of the second n-type transistor and one of a source and a drain of the second n-type transistor are connected, and the other one of the source and the drain of the second n-type transistor is connected to the third wiring line.
2. An electronic device comprising the electro-optic device according to claim 1.

3. The electro-optic device according to claim 1, wherein an on-state electric current of the first p-type transistor is the same as a current of the second p-type transistor.

4. The electro-optic device according to claim 1, wherein an on-state electric current of the first n-type transistor is the same as a current of the second n-type transistor.

* * * * *

UNITED STATES PATENT AND TRADEMARK OFFICE
CERTIFICATE OF CORRECTION

PATENT NO. : 9,768,158 B2
APPLICATION NO. : 15/337234
DATED : *September 19, 2017
INVENTOR(S) : Hidenori Sokabe and Masahito Yoshii Page 1 of 1

It is certified that error appears in the above-identified patent and that said Letters Patent is hereby corrected as shown below:

On the Title Page

Date of Patent: Sep. 19, 2017
Is corrected to:
Date of Patent: *Sep. 19, 2017 and (*) Notice: Subject to any disclaimer, the term of this patent is extended or adjusted under 35 U.S.C. 154(b) by 0 days.

Is corrected to:

(*) Notice: Subject to any disclaimer, the term of this patent is extended or adjusted under 35 U.S.C. 154(b) by 0 days.

This patent is subject to a terminal disclaimer.

Signed and Sealed this
Thirteenth Day of March, 2018

Andrei Iancu
*Director of the United States Patent and Trademark Office*